United States Patent
Lee et al.

(10) Patent No.: US 11,621,196 B2
(45) Date of Patent: Apr. 4, 2023

(54) SEMICONDUCTOR DEVICE AND METHOD FOR FABRICATING THE SAME

(71) Applicant: Samsung Electronics Co., Ltd., Suwon-si (KR)

(72) Inventors: Sang Hyun Lee, Hwaseong-si (KR); Jeong Yun Lee, Yongin-si (KR); Seung Ju Park, Hwaseong-si (KR); Geum Jung Seong, Seoul (KR); Young Mook Oh, Hwaseong-si (KR); Seung Soo Hong, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 110 days.

(21) Appl. No.: 17/328,348

(22) Filed: May 24, 2021

(65) Prior Publication Data
US 2021/0280469 A1 Sep. 9, 2021

Related U.S. Application Data

(63) Continuation of application No. 16/460,127, filed on Jul. 2, 2019, now Pat. No. 11,037,829, which is a
(Continued)

(30) Foreign Application Priority Data

Nov. 14, 2016 (KR) .................. 10-2016-0150806

(51) Int. Cl.
*H01L 29/78* (2006.01)
*H01L 21/8234* (2006.01)
(Continued)

(52) U.S. Cl.
CPC ........... *H01L 21/823462* (2013.01); *H01L 21/823437* (2013.01); *H01L 21/823481* (2013.01);
(Continued)

(58) Field of Classification Search
CPC ............ H01L 29/785; H01L 27/0886; H01L 21/823431
See application file for complete search history.

(56) References Cited

U.S. PATENT DOCUMENTS 7,052,983 B2  5/2006  Park et al.
8,399,352 B2  3/2013  Werner et al.
(Continued)

FOREIGN PATENT DOCUMENTS

JP       5660651        7/2014
KR   10-2015-0072796    6/2015

OTHER PUBLICATIONS

First Office Action dated Nov. 29, 2022 for corresponding application CN 201711120568.7.

*Primary Examiner* — Mark V Prenty
(74) *Attorney, Agent, or Firm* — Muir Patent Law, PLLC

(57) ABSTRACT

A semiconductor device capable of improving operation performance and reliability, may include a gate insulating support to isolate gate electrodes that are adjacent in a length direction. The semiconductor device includes a first gate structure on a substrate, the first gate structure extending lengthwise in a first direction to have two long sides and two short sides, relative to each other, and including a first gate spacer; a second gate structure on the substrate, the second gate structure extending lengthwise in the first direction to have two long sides and two short sides, relative to each other, and including a second gate spacer, wherein a first short side of the second gate structure faces a first short side of the first gate structure; and a gate insulating support disposed between the first short side of the first gate structure and the first short side of the second gate structure and extending lengthwise in a second direction different from the first direction, a length of the gate insulating support in the
(Continued)

second direction being greater than a width of each of the first gate structure and the second gate structure in the second direction.

20 Claims, 45 Drawing Sheets

Related U.S. Application Data continuation of application No. 15/718,482, filed on Sep. 28, 2017, now Pat. No. 10,395,990.

(51) Int. Cl.
| | |
|---|---|
| *H01L 27/088* | (2006.01) |
| *H01L 29/417* | (2006.01) |
| *H01L 21/8238* | (2006.01) |
| *H01L 29/08* | (2006.01) |
| *H01L 29/423* | (2006.01) |
| *H01L 29/66* | (2006.01) |

(52) U.S. Cl.
CPC .... *H01L 21/823821* (2013.01); *H01L 27/088* (2013.01); *H01L 29/0847* (2013.01); *H01L 29/41791* (2013.01); *H01L 29/42364* (2013.01); *H01L 29/785* (2013.01); *H01L 21/823431* (2013.01); *H01L 21/823468* (2013.01); *H01L 21/823475* (2013.01); *H01L 27/0886* (2013.01); *H01L 29/6656* (2013.01)

(56) References Cited

U.S. PATENT DOCUMENTS

| | | | |
|---|---|---|---|
| 8,455,932 | B2 | 6/2013 | Khakifirooz et al. |
| 8,921,136 | B2 | 12/2014 | Chen et al. |
| 8,947,912 | B2 | 2/2015 | Calhoun et al. |
| 9,196,548 | B2 | 11/2015 | Rashed et al. |
| 9,281,371 | B2 | 3/2016 | Smayling |
| 9,324,715 | B2 | 4/2016 | Azmat et al. |
| 10,084,041 | B2 | 9/2018 | Cheng |
| 10,395,990 | B2 | 8/2019 | Lee et al. |
| 11,037,829 | B2 * | 6/2021 | Lee ...................... H01L 29/785 |
| 2015/0129961 | A1 | 5/2015 | Li et al. |
| 2016/0056181 | A1 | 2/2016 | Anderson et al. |
| 2016/0093614 | A1 | 3/2016 | Cheng et al. |

\* cited by examiner

SEMICONDUCTOR DEVICE AND METHOD FOR FABRICATING THE SAME

CROSS-REFERENCE TO RELATED APPLICATION

This application is a continuation application of U.S. application Ser. No. 16/460,127, filed Jul. 2, 2019, which is a continuation application of U.S. application Ser. No. 15/718,482, filed Sep. 28, 2017, which claims priority under 35 U.S.C. 119 to Korean Patent Application No. 10-2016-0150806 filed on Nov. 14, 2016 in the Korean Intellectual Property Office, the contents of each of which in their entirety are herein incorporated by reference.

BACKGROUND

1. Technical Field

The present disclosure relates to a semiconductor device and a method for fabricating the same.

2. Description of the Related Art

The recent dramatic increase in the distribution of information media has led into remarkable advancement in the functionalities of semiconductor devices. To ensure higher competitiveness, new semiconductor products are often required to meet demands for lower cost and higher quality by way of higher integration. The semiconductor scale-down continues to achieve higher integration.

A decreasing interval between gates of transistors causes considerably decreasing intervals between contacts formed on a gate of the transistor and a source/drain of the transistor. This may cause deficiencies related to the electrical connections between the transistors.

SUMMARY

An object of the present disclosure is to provide a semiconductor device capable of improving operation performance and reliability, by forming a gate insulating support to isolate gate electrodes that are adjacent in a length direction.

Another technical object of the present disclosure is to provide a method for fabricating a semiconductor device capable of improving operation performance and reliability, by forming the gate insulating support to isolate the gate electrodes that are adjacent in a length direction.

The objects according to the present disclosure are not limited to those set forth above and objects other than those set forth above will be clearly understood to a person skilled in the art from the following description.

According to an aspect of the present inventive concept, a semiconductor device includes a first gate structure on a substrate, the first gate structure extending lengthwise in a first direction to have two long sides and two short sides, relative to each other, and including a first gate spacer; a second gate structure on the substrate, the second gate structure extending lengthwise in the first direction to have two long sides and two short sides, relative to each other, and including a second gate spacer, wherein a first short side of the second gate structure faces a first short side of the first gate structure; and a gate insulating support disposed between the first short side of the first gate structure and the first short side of the second gate structure and extending lengthwise in a second direction different from the first direction, a length of the gate insulating support in the second direction being greater than a width of each of the first gate structure and the second gate structure in the second direction.

According to another aspect of the present inventive concept, a semiconductor device includes a field insulating film on a substrate; a first gate structure on the field insulating film, the first gate structure extending lengthwise in a first direction and including a first gate spacer; a second gate structure on the field insulating film, the second gate structure extending lengthwise in the first direction and including a second gate spacer; at least one third gate structure extending lengthwise in the first direction and including a third gate spacer, the at least one third gate structure disposed between the first and second gate structures; and a gate insulating support on the field insulating film and disposed between the first gate structure and the second gate structure, the a gate insulating support including a long side extending in a second direction different from the first direction and a short side extending in the first direction, wherein a sidewall on one long side of the gate insulating support is in contact with the third gate structure, and a portion of the gate insulating support extends from a sidewall of the third gate structure to the first gate structure and the second gate structure.

According to still another aspect of the present inventive concept, a semiconductor device includes a first fin-type pattern extending in a first direction; a second fin-type pattern extending in the first direction, and being adjacent to the first fin-type pattern in a second direction different form the first direction; a first gate structure on the first fin-type pattern, the first gate structure intersecting the first fin-type pattern and including a first gate spacer; a second gate structure on the second fin-type pattern, the second gate structure intersecting the second fin-type pattern and including a second gate spacer; a gate insulating support extending in the first direction between the first gate structure and the second gate structure, a width of the gate insulating support in the first direction being greater than a width of the first gate structure in the first direction and greater than a width of the second gate structures in the first direction; a first epitaxial pattern on at least one side of the first gate structure and formed on the first fin-type pattern; a second epitaxial pattern on at least one side of the second gate structure and formed on the second fin-type pattern; and a conductive jumper on the gate insulating support, the conductive jumper intersecting the gate insulating support, and being electrically connected to the first epitaxial pattern and the second epitaxial pattern.

According to still another aspect of the present inventive concept, there is provided a semiconductor device comprising a substrate including an SRAM region and a logic region; a first gate structure on the substrate in the SRAM region, the a first gate structure extending in a first direction and including a first gate spacer; a second gate structure on the substrate, the second gate structure extending in the first direction and including a second gate spacer, a short side of the second gate structure facing a short side of the first gate structure; a first gate insulating support disposed between the first gate structure and the second gate structure and extending in a second direction different from the first direction, a width of the first gate insulating support in the second direction being greater than a width of the first gate structure in the second direction and greater than a width of the second gate structures in the second direction; a third gate structure on the substrate in the logic region, the third gate structure extending in the first direction to have a long side and a short side, and including a first gate electrode; a fourth gate structure on the substrate, the fourth gate structure extending in the first direction to have a long side and a short side, and including a second gate electrode, the short side of the fourth gate structure facing the short side of the third gate structure; and a second gate insulating support between the first gate electrode and the second gate electrode and isolating the first gate electrode and the second gate electrode from each other.

According to still another aspect of the present inventive concept, a semiconductor device includes a first gate structure on a substrate, the first gate structure extending lengthwise in a first direction to have two long sides and two short sides, relative to each other; a second gate structure on the substrate, the second gate structure extending lengthwise in the first direction to have two long sides and two short sides, relative to each other, wherein a first short side of the second gate structure faces a first short side of the first gate structure; a third gate structure on the substrate, the third gate structure extending lengthwise in the first direction to have two long sides and two short sides, relative to each other; and an insulation block disposed between the first short side of the first gate structure and the first short side of the second gate structure and adjacent a first long side of the third gate structure, the insulation block extending lengthwise in a second direction different from the first direction, a length of the insulation block in the second direction being greater than a width of each of the first gate structure and the second gate structure in the second direction.

According to still another aspect of the present inventive concept, there is provided a method for fabricating a semiconductor device comprising forming a gate structure on a substrate, the gate structure extending in a first direction and including a gate electrode and a gate spacer on a sidewall of the gate electrode; forming an interlayer insulating film on the substrate, the interlayer insulating film surrounding a sidewall of the gate spacer and exposing the gate electrode; forming a mask pattern on the interlayer insulating film, the mask pattern having an opening exposing a portion of the gate electrode and a portion of the interlayer insulating film, a width of the opening in a second direction different from the first direction being greater than a width of the gate structure in the second direction; forming a trench extending in the second direction within the interlayer insulating film and the gate structure by removing the gate structure and the interlayer insulating film exposed by the opening; and forming a gate insulating support within the trench, the gate insulating support including an upper surface that is coplanar with the upper surface of the interlayer insulating film.

BRIEF DESCRIPTION OF THE DRAWINGS

The above and other objects, features and advantages of the present disclosure will become more apparent to those of ordinary skill in the art by describing in detail example embodiments thereof with reference to the accompanying drawings.

DETAILED DESCRIPTION

Figure 1:
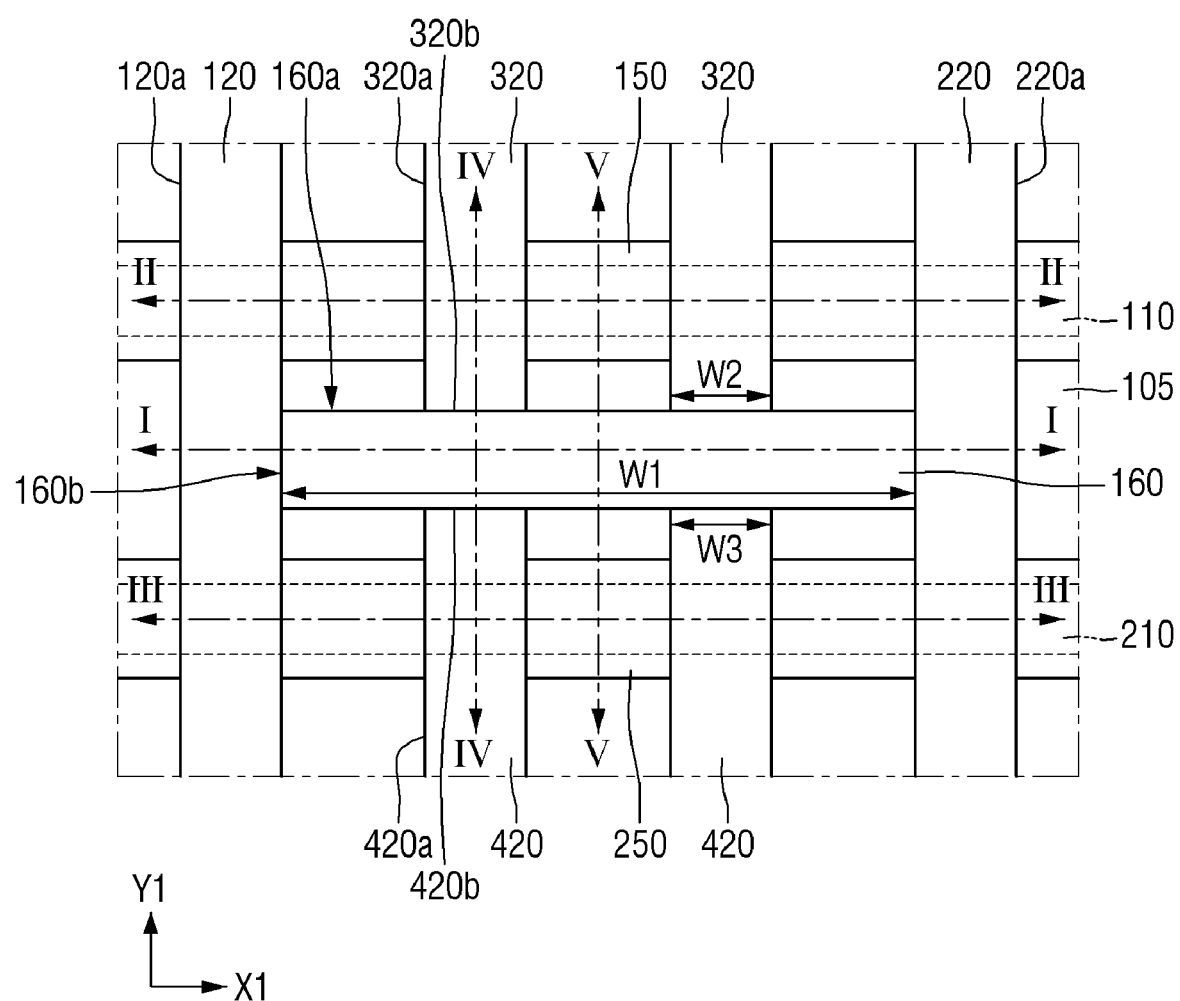
FIG. 1 is a top view provided to explain a semiconductor device according to some example embodiments.

In the drawings, the size and relative sizes of layers and regions may be exaggerated for clarity. Like numbers refer to like elements throughout. Though the different figures show variations of exemplary embodiments, and may be referred to using language such as "in one embodiment," these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

Although drawings for a semiconductor device according to some example embodiments exemplify a fin-type transistor (FinFET) including a channel region in a fin-type pattern shape, example embodiments are not limited thereto. It is of course possible that the semiconductor device according to some example embodiments may include a tunneling transistor (tunneling FET), a transistor including nanowire, a transistor including nano-sheet, or a three-dimensional 3D transistor. Further, the semiconductor device according to some example embodiments may include a bipolar junction transistor, a laterally diffused metal oxide semiconductor LDMOS transistor, and so on.

Moreover, while the semiconductor device according to some example embodiments is exemplified as a multi-channel transistor using the fin-type pattern, the semiconductor device may be a planar transistor as well.

As used herein, a semiconductor device may refer, for example, to a device such as a semiconductor chip (e.g., memory chip and/or logic chip formed on a die) that includes one or more of the transistors or other components described in this specification. A semiconductor device may also refer to a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

FIG. 1 is a top view provided to explain a semiconductor device according to some example embodiments. FIGS. 2 to 6 are respective cross sectional views taken on lines I-I, IV-IV and V-V of FIG. 1.

For convenience of explanation, FIG. 1 skips illustrations of a lower interlayer insulating film 191 and an upper interlayer insulating film 192.

Referring to FIGS. 1 to 6, the semiconductor device according to some example embodiments may include a first fin-type pattern 110, a second fin-type pattern 210, a first gate structure 120, a second gate structure 220, a third gate structure 320, a fourth gate structure 420, and a first gate insulating support 160.

A substrate 100 may be a bulk silicon or a silicon-on-insulator SOI. Alternatively, the substrate 100 may be a silicon substrate, or may include another material such as silicon germanium, silicon germanium on insulator (SGOI), indium antimonide, lead telluride, indium arsenide, indium phosphide, gallium arsenide, or gallium antimonide, but is not limited thereto.

The first fin-type pattern 110 and the second fin-type pattern 210 may protrude from the substrate 100, respectively. As used herein, such protrusion from the substrate may include a protrusion from a bottom, continuous horizontal portion of the substrate. For example, whether the first fin-type pattern 110 and second fin-type pattern 210 are continuously formed from the substrate (e.g., via an etching process that removes portions of the substrate), or are grown on the substrate (e.g., via epitaxial growth), either case may refer to the fin-type patterns as protruding from the substrate. The first fin-type pattern 110 and the second fin-type pattern 210 may extend longitudinally on the substrate 100 along a first direction X1. For example, the first and second fin-type patterns 110, 210 may respectively include a long side extending in the first direction X1 and a short side extending in a second direction Y1.

In one embodiment, the first fin-type pattern 110 and the second fin-type pattern 210 may be a part of the substrate 100, and may include an epitaxial layer grown from the substrate 100. The first fin-type pattern 110 and the second fin-type pattern 210 may include an element semiconductor material such as silicon or germanium, respectively. Further, the first fin-type pattern 110 and the second fin-type pattern 210 may include a compound semiconductor such as IV-IV group compound semiconductor or III-V group compound semiconductor. Specifically, take the IV-IV group compound semiconductor as an example, the first fin-type pattern 110 and the second fin-type pattern 210 may be a binary compound or a ternary compound including at least two or more of carbon (C), silicon (Si), germanium (Ge) and tin (Sn), or these compounds doped with IV group element. Take the III-V group compound semiconductor as an example, the first fin-type pattern 110 and the second fin-type pattern 210 may be one of a binary compound, a ternary compound or a quaternary compound which is formed by a combination of a III group element, which may be at least one of aluminum (Al), gallium (Ga), or indium (In), and a V group element, which may be one of phosphorus (P), arsenic (As) and antimony (Sb).

In the semiconductor device according to some example embodiments, it is described that the first fin-type pattern 110 and the second fin-type pattern 210 are silicon fin-type patterns including silicon.

A field insulating film 105 may be formed on the substrate 100. The field insulating film 105 may partially cover the first fin-type pattern 110 and the second fin-type pattern 210. For example, the field insulating film 105 may partially cover a sidewall of the first fin-type pattern 110 and the second fin-type pattern 210. Upper surfaces of the first fin-type pattern 110 and upper surfaces of the second fin-type pattern 210 may protrude upward higher than an upper surface of the field insulating film 105 formed adjacently to long sides of the first fin-type pattern 110 and the second fin-type pattern 210. The first fin-type pattern 110 and the second fin-type pattern 210 may be defined by the field insulating film 105 on the substrate 100. For example, the field insulating film 105 may include at least one of silicon oxide film, silicon nitride film, or silicon oxynitride film. The field insulating film 105 may also be referred to as a field insulating layer 105.

Further, the field insulating film 105 may additionally include at least one field liner film formed between the first fin-type pattern 110 and the field insulating film 105 and between the second fin-type pattern 210 and the field insulating film 105. When the field insulating film 105 additionally includes the field liner film, the field liner film may include at least one of polysilicon, amorphous silicon, silicon oxynitride, silicon nitride, or silicon oxide.

The first gate structure 120 and the second gate structure 220 may extend in the second direction Y1 on the field insulating film 105, respectively. The first gate structure 120 and the second gate structure 220 may be respectively formed on the first fin-type pattern 110 and the second fin-type pattern 210, while intersecting and crossing over the first fin-type pattern 110 and the second fin-type pattern 210. The first gate structure 120 and the second gate structure 220 may be disposed with spacing between each other in the first direction X1. For example, a long side 120a of the first gate structure and a long side 220a of the second gate structure may extend in the second direction, and face or be opposite each other.

At least one of the third gate structures 320 and at least one of the fourth gate structures 420 may be disposed between the first gate structure 120 and the second gate structure 220. The third gate structure 320 and the fourth gate structure 420 may extend in the second direction Y1 on the field insulating film 105. The third gate structure 320 may be formed on the first fin-type pattern 110, while intersecting and crossing over the first fin-type pattern 110. The fourth gate structure 420 may be formed on the second fin-type pattern 210, while intersecting and crossing over the second fin-type pattern 210.

A long side 320a of the third gate structure may extend in the second direction Y1, and may face or be opposite the long side 120a of the first gate structure and the long side 220a of the second gate structure. A long side 420a of the fourth gate structure may extend in the second direction Y1, and may face or be opposite the long side 120a of the first gate structure and the long side 220a of the second gate structure. Further, a short side 320b of the third gate structure and a short side 420b of the fourth gate structure may extend in the first direction X1, and face or be opposite each other.

Each of the first to fourth gate structures 120, 220, 320, 420 may include gate electrodes 130, 230, 330, 430, gate insulating films 135, 235, 335, 435, gate spacers 140, 240, 340, 440, gate trenches 140t, 240t, 340t, 440t defined by the gate spacers 140, 240, 340, 440, and capping patterns 145, 245, 345, 445.

The first gate electrode 130 and the second gate electrode 230 may be respectively formed on the first fin-type pattern 110, the field insulating film 105, and the second fin-type pattern 210. Each of the first gate electrode 130 and the second gate electrode 230 may surround the first fin-type pattern 110 and the second fin-type pattern 210 which protrude upward higher than the upper surface of the field insulating film 105. The third gate electrode 330 may be formed on the first fin-type pattern 110 and the field insulating film 105, and the fourth gate electrode 430 may be formed on the second fin-type pattern 210 and the field insulating film 105.

The first to fourth gate electrodes 130, 230, 330, 430 may each include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and a combination thereof.

In one embodiment, the first to fourth gate electrodes 130, 230, 330, 430 may be formed through a replacement process (or gate last process), but the method of formation is not limited thereto.

In the semiconductor device according to some example embodiments, the first to fourth gate electrodes 130, 230, 330, 430 may each fill portions of the gate trenches 140t, 240t, 340t, 440t.

Although FIG. 1 illustrates two third gate structure 320 and two fourth gate structure 420 disposed between the first gate structure 120 and the second gate structure 220, this is illustrated merely for convenience of explanation, and example embodiments are not limited thereto.

Figure 4:
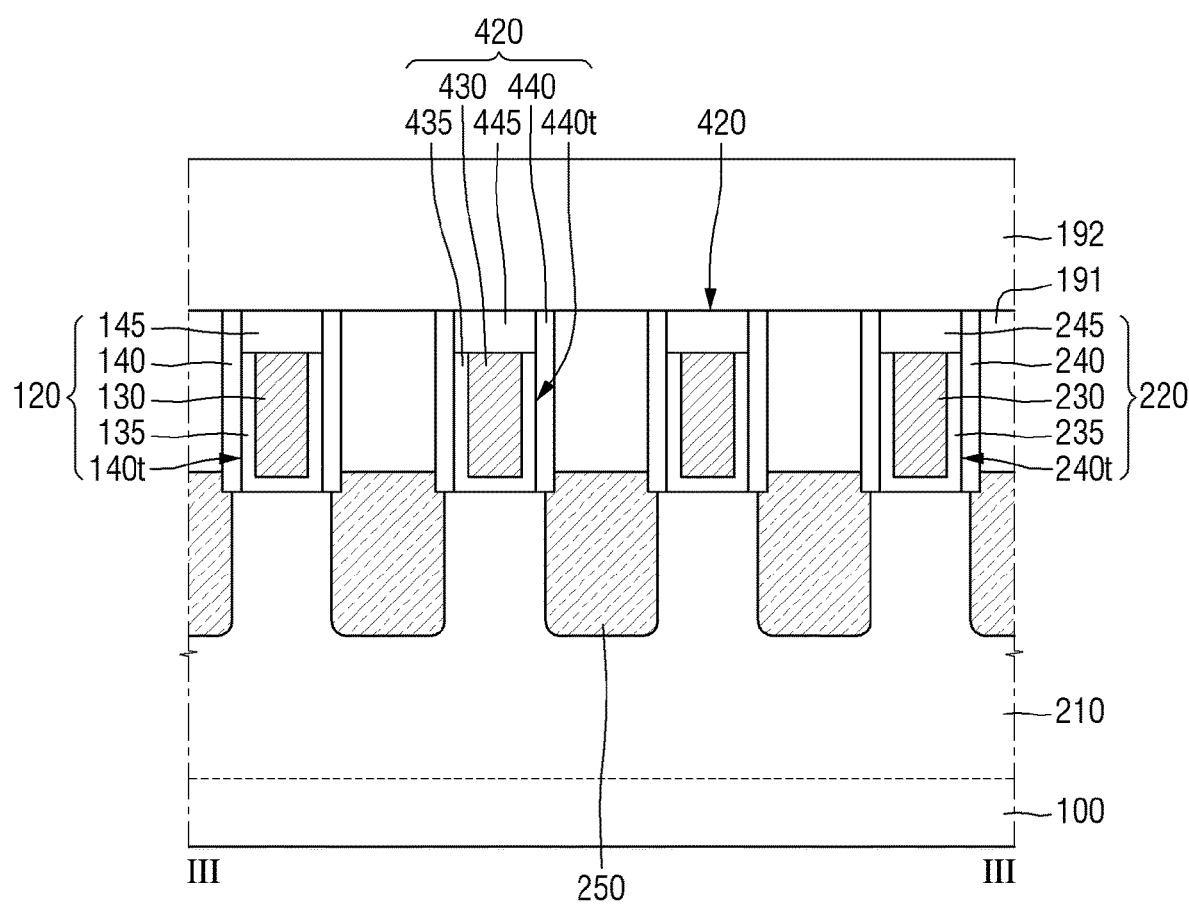

Further, although FIG. 4 illustrates that only the fourth gate structure 420 used as a gate of the transistor being formed between the first gate structure 120 and the second gate structure 220, example embodiments are not limited thereto.

For example, between the first gate structure 120 and the second gate structure 220, not only the fourth gate structure 420, but also a device isolating pattern, including a trench formed within the second fin-type pattern 210 and a device isolating film filling the trench, may be formed.

The first to fourth gate spacers 140, 240, 340, 440 may be respectively formed on the sidewalls of the first to fourth gate electrodes 130, 230, 330, 430. For example, each of the first to fourth gate spacers 140, 240, 340, 440 may include at least one of silicon nitride (SiN), silicon oxynitride (SiON), silicon oxide (SiO$_2$), and silicon oxycarbonitride (SiOCN).

The first and second gate insulating films 135, 235 may be respectively formed on the first fin-type pattern 110 and the second fin-type pattern 210 and the field insulating film 105. A third gate insulating film 335 may be formed on the first fin-type pattern 110 and the field insulating film 105, and a fourth gate insulating film 435 may be formed on the second fin-type pattern 210 and the field insulating film 105.

The first to fourth gate insulating films 135, 235, 335, 435 may be respectively formed along a profile of the first fin-type pattern 110 and/or a profile of the second fin-type pattern 210, which protrude upward higher than the field insulating film 105. The first to fourth gate insulating films 135, 235, 335, 435 may each extend along the sidewalls and the bottom surfaces of the gate trenches 140t, 240t, 340t, 440t.

Figure 3:
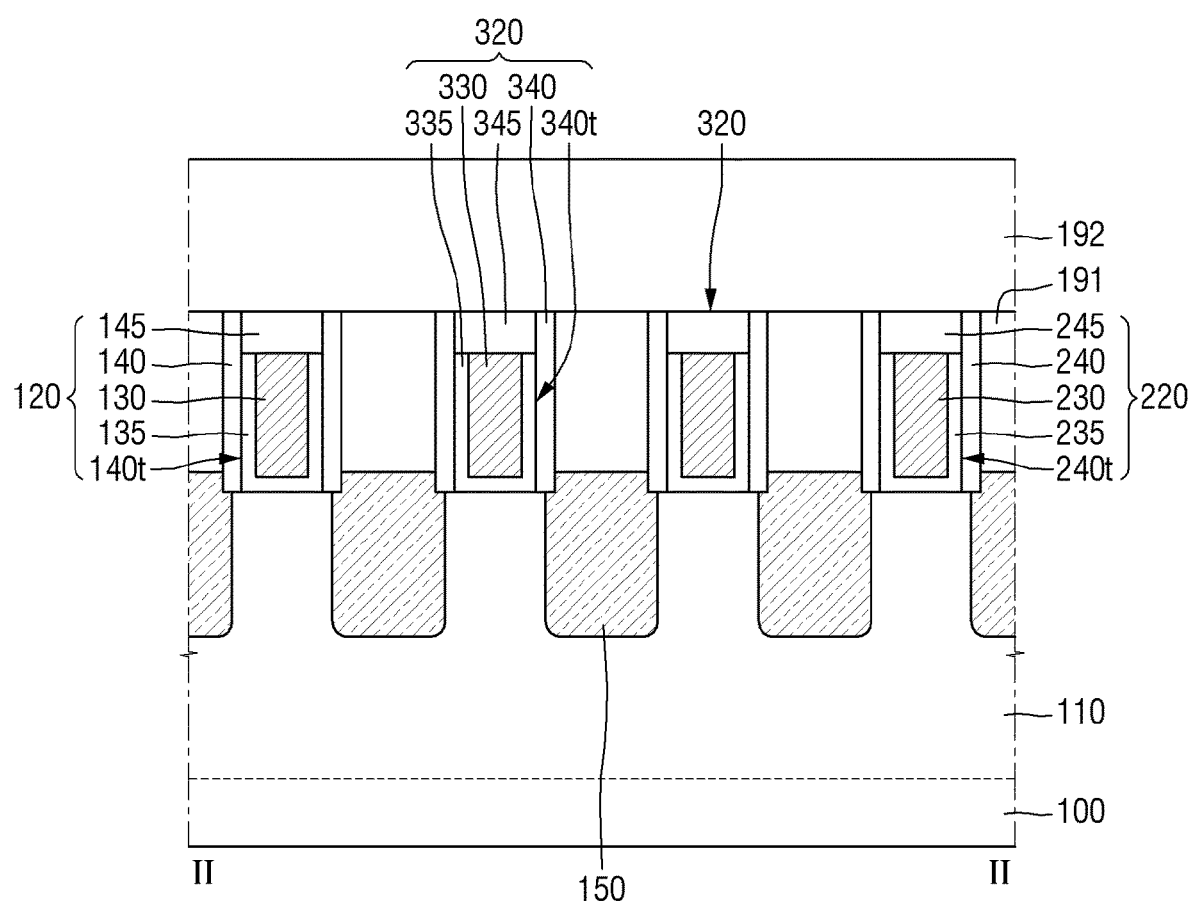

Further, differently from FIG. 3, an interfacial layer may be additionally formed between the first to third gate insulating films 135, 235, 335 and the first fin-type pattern 110. When the first fin-type pattern 110 is a silicon fin-type pattern, the interfacial layer may include silicon oxide, for example. The interfacial layer may likewise be additionally formed between the first, second and fourth gate insulating films 135, 235, 435 and the second fin-type pattern 210.

The first to fourth gate insulating films 135, 235, 335, 435 may include a high-k dielectric material having a higher dielectric constant than a silicon oxide film. For example, the first to fourth gate insulating films 135, 235, 335, 435 may include one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The first to fourth capping patterns 145, 245, 345, 445 may be respectively formed on the gate electrodes 130, 230, 330, 430. The first to fourth capping patterns 145, 245, 345, 445 may each fill the gate trenches 140t, 240t, 340t, 440t remaining after the gate electrodes 130, 230, 330, 430 are formed. The first to fourth capping patterns 145, 245, 345, 445 may include a material having etch selectivity with respect to the lower interlayer insulating film 191. For example, the first to fourth capping patterns 145, 245, 345, 445 may each include at least one of silicon oxide ($SiO_2$), silicon nitride (SiN), silicon carbonitride (SiCN), and silicon oxycarbonitride (SiOCN).

Figure 2:
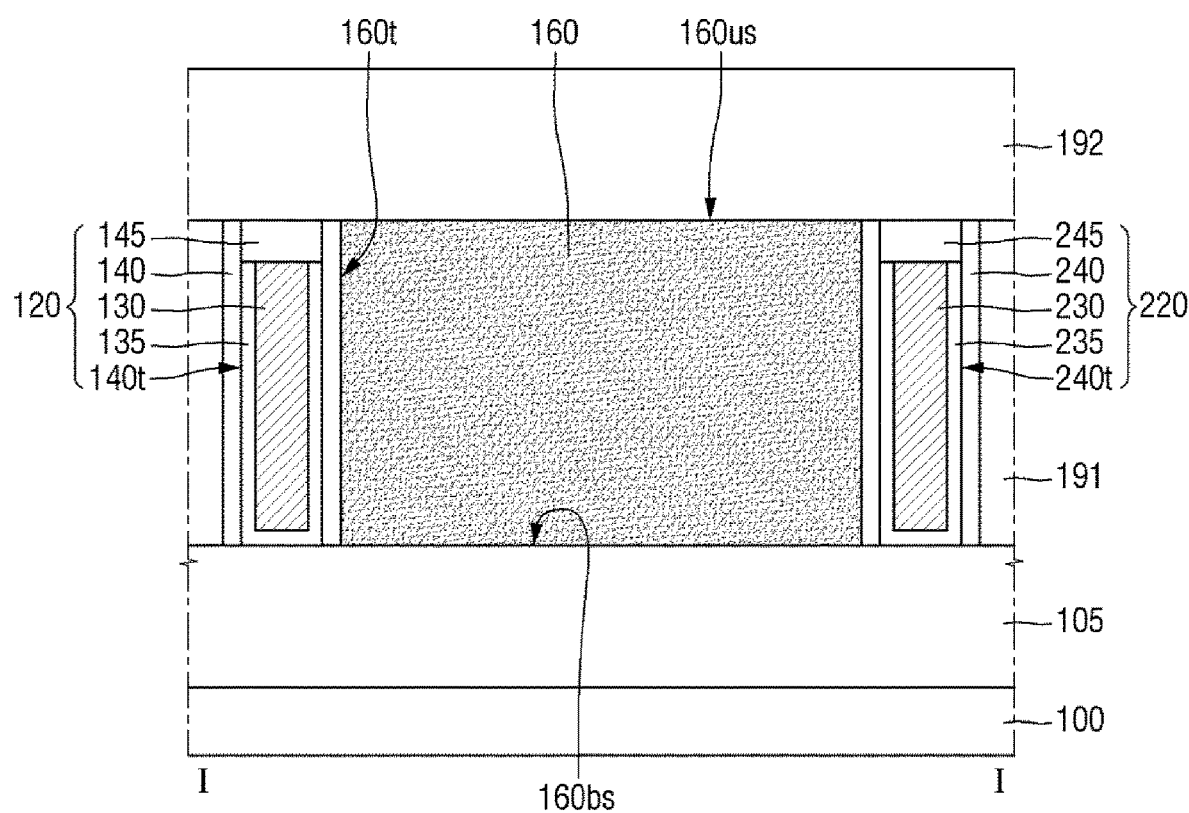
FIGS. 2 to 6 are respective cross sectional views taken on lines I-I, IV-IV and V-V of FIG. 1.

FIGS. 2 and 3 illustrate that the first to fourth gate insulating films 135, 235, 335, 435 may not extend between the first to fourth capping patterns 145, 245, 345, 445 and the first to fourth gate spacers 140, 240, 340, 440, but example embodiments are not limited thereto.

A first epitaxial pattern 150 may be formed on at least one side of the third gate structure 320. A second epitaxial pattern 250 may be formed on at least one side of the fourth gate structure 420. The first epitaxial pattern 150 may be formed on the first fin-type pattern 110, and the second epitaxial pattern 250 may be formed on the second fin-type pattern 210. The first epitaxial pattern 150 and the second epitaxial pattern 250 corresponding to each other may be arranged in the second direction Y1. The first epitaxial pattern 150 may be included within the source/drain of a transistor that uses the first fin-type pattern 210 as a channel region, and the second epitaxial pattern 250 may be included in the source/drain of a transistor that uses the second fin-type pattern 210 as a channel region.

The lower interlayer insulating film 191 (also described as a lower interlayer insulating layer 191) may be formed on the field insulating film 105, and may cover the first epitaxial pattern 150 and the second epitaxial pattern 250. The lower interlayer insulating layer 191 may be formed on a periphery of the first to fourth gate structures 120, 220, 320, 420. The lower interlayer insulating layer 191 may cover at least a portion of the sidewalls of the first to fourth gate structures 120, 220, 320, 420.

The first gate insulating support 160 may be disposed between the third gate structure 320 and the fourth gate structure 420. The first gate insulating support 160 may be disposed between the short side 320b of the third gate structure and the short side 420b of the fourth gate structure. Further, the first gate insulating support 160 may be disposed between the first gate structure 120 and the second gate structure 220. The first gate insulating support 160 may be disposed between the long side 120a of the first gate structure and the long side 220a of the second gate structure. The first gate insulating support 160 may be formed on the field insulating film 105 positioned between the first fin-type pattern 110 and the second fin-type pattern 210. The first gate insulating support 160 may be formed within a first isolating trench 160t defined by the lower interlayer insulating film 191, and the first to fourth gate structures 120, 220, 320, 420.

The first gate insulating support 160 may extend longitudinally in the first direction X1. That is, the first gate insulating support 160 may include a long side 160a extending in the first direction X1 and a short side 160b extending in the second direction Y1. Each gate insulating support described herein may be an integrally, continuously formed, monolithic structure disposed between other materials that form the various components of the semiconductor device it is a part of. For example, the gate insulating support may be formed of different materials from its surrounding components, and/or may be formed at a different time as its surrounding components, and may be formed to have side surfaces that contact side surfaces of its surrounding components. For example, in some embodiments, a single side surface of a monolithic, continuously and integrally formed gate insulating support will contact a plurality of coplanar surfaces of different components or material portions, disposed consecutively along the single side surface. Each gate insulating support may form an insulation block placed between ends of two gate structures. In some embodiments, the insulation block contacts ends of two gate structures or gate electrodes that face each other, and may contact additional gate structures as well. One sidewall including the long side 160a of the first gate insulating support may be in contact with the third gate structure 320, and the other sidewall including the long side 160a of the first gate insulating support may be in contact with the fourth gate structure 420. The third gate structure 320 and the fourth gate structure 420 may be isolated by the first gate insulating support 160. The first gate insulating support 160 may isolate the third gate electrode 330 and the fourth gate electrode 430, for example, by being formed between the third gate electrode 330 and the fourth gate electrode 430 in their lengthwise directions.

A width W1 of the first gate insulating support 160 in the first direction X1 (also described as a length) may be greater than a width W2 of the third gate structure 320 in the first direction X1 and a width W3 of the fourth gate structure 420 in the first direction X1. For example, the first gate insulating support 160 may be disposed between the first and second epitaxial patterns 150, 250 facing each other in the second direction Y1 as well as between the third and fourth gate structures 320, 420 facing each other. The first and second epitaxial patterns 150, 250 may face each other with reference to the first gate insulating support 160. For example, a portion of the first gate insulating support 160 may extend from a sidewall including the long sides 320a, 420a of the third and fourth gate structures, toward the first and second gate structures 120, 220. The first gate insulating support 160 may include a portion which does not overlap with the third and fourth gate structures 320, 420 in the second direction Y1.

An upper surface 160us of the first gate insulating support may be coplanar with an upper surface of the lower interlayer insulating film 191 and the upper surfaces of the first to fourth gate structures 120, 220, 320, 420. More specifically, the upper surface 160us of the first gate insulating support may be coplanar with the upper surfaces of the first to fourth capping patterns 145, 245, 345, 445.

The first gate insulating support 160 may include a material having etch selectivity with respect to the lower interlayer insulating film 191. As such, the first gate insulating support 160 (and other gate insulating supports described herein) may be formed of a different material from that which forms the lower interlayer insulating film 191. For example, the first gate insulating support 160 may include at least one of silicon oxide (SiO$_2$), silicon nitride (SiN), silicon oxynitride (SiON), silicon carbonitride (SiCN) and silicon oxycarbon nitride (SiOCN).

The first gate insulating support 160 may be in contact with the first and second gate spacers 140, 240. For example, in one embodiment, the lower interlayer insulating film 191 is not interposed between the short side 160*b* of the first gate insulating support and the first gate structure 120 and between the short side 160*b* of the first gate insulating support and the second gate structure 220.

Figure 5:
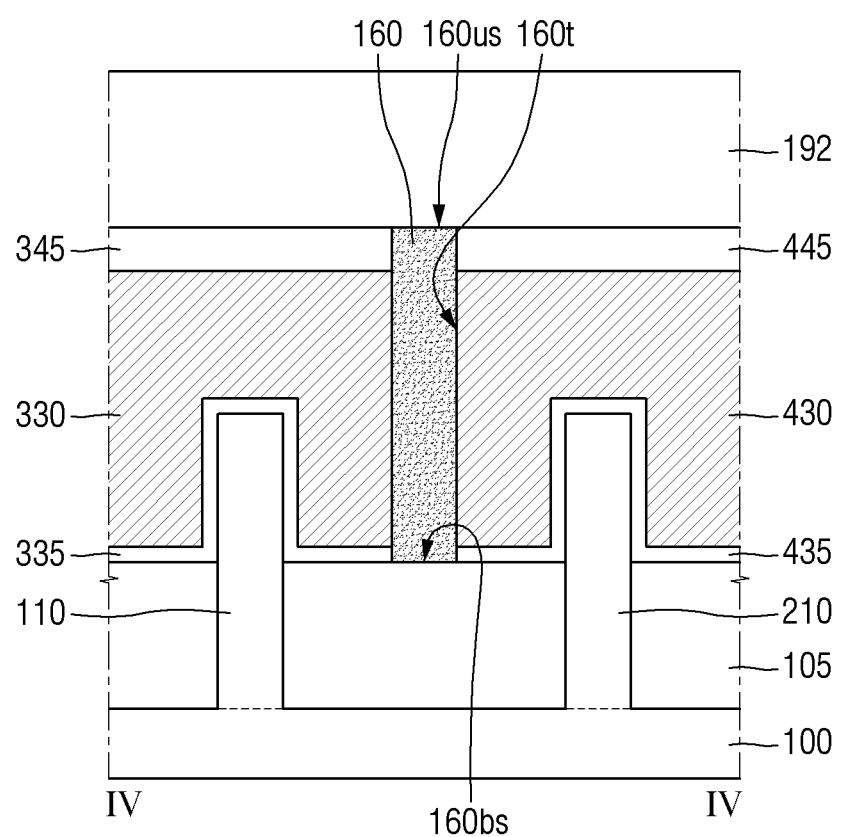
Figure 6:
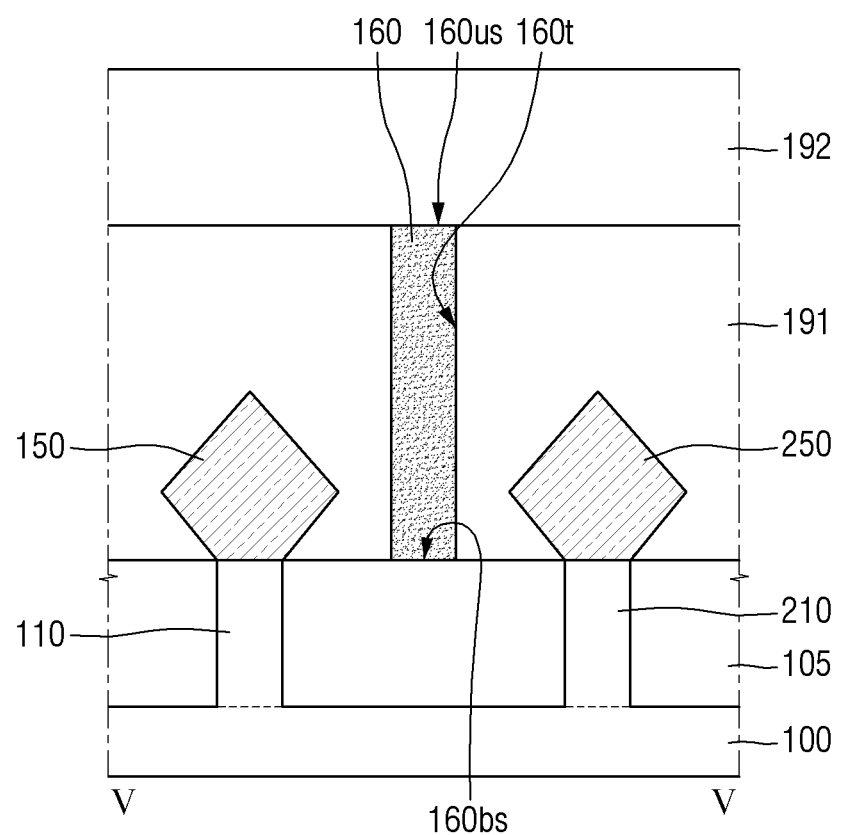

In a cross sectional view along the second direction Y1 of FIG. 5, a height from the substrate 100 to a bottom surface 160*bs* (e.g., bottom-most surface) of the first gate insulating support may be less than or equal to a height from the substrate 100 to the bottom surfaces (e.g., bottom-most surfaces) of the third and fourth gate structures 320, 420. For example, at least a portion of the bottom surface 160*bs* of the first gate insulating support may be closer to the substrate 100 than to the bottom surfaces of the third and fourth gate structures 320, 420.

Further, in FIGS. 2 and 5, the bottom surface 160*bs* of the first gate insulating support may be entirely defined by the field insulating film 105. A spacer connecting the lower interlayer insulating film 191 with the third and fourth gate spacers 340, 440 may not be interposed between the bottom surface 160*bs* of the first gate insulating support and the field insulating film 105. For example, the bottom surface 160*bs* of the first gate insulating support may be coplanar with the bottom surfaces of the first and second gate structures 120, 220.

Additionally, the third gate spacer 340 may not be formed on the short side 320*b* of the third gate structure, and the fourth gate spacer 440 may not be formed on the short side 420*b* of the fourth gate structure. Thus, the third gate spacer 340 may not be formed between the third gate electrode 330 and the first gate insulating support 160, and the fourth gate spacer 440 may not be formed between the fourth gate electrode 430 and the first gate insulating support 160.

Each of the third gate insulating film 335 and the fourth gate insulating film 435 may not extend along a sidewall of the first gate insulating support 160. For example, the third and fourth gate insulating films 335, 435 may not be respectively formed on a sidewall including the long side 160*a* of the first gate insulating support. Further, the bottom surface 160*bs* of the first gate insulating support 160 may contact the field insulating film 105, and so no gate insulating film is between the bottom surface 160*bs* of the first gate insulating support 160 and a top surface of the field insulating film 105.

As shown in FIGS. 1-5, the first gate insulating support 160 may be an insulation block formed in an area between a plurality of gate structures, and may terminate on four sides (e.g., four sidewalls) at the plurality of gate structures. For example, in FIG. 1, long sides (e.g., two lengthwise sidewalls opposite each other) of the gate insulating support 160 terminate at and contact ends of four gate structures (e.g., two third gate structures 320, and two fourth gate structures 420), and short sides (e.g., two widthwise sidewalls) of the gate insulating support 160 terminate at and contact sidewalls (e.g., lengthwise sidewalls) of two gate structures (e.g., first gate structure 120 and second gate structure 220). Therefore, the first gate insulating support 160 may be disposed so at least one lengthwise sidewall terminates and contacts at least one gate structure, and at least one widthwise sidewall terminates at and contacts at least one different gate structure.

An upper interlayer insulating film 192 may be formed on the lower interlayer insulating film 191, the first gate insulating support 160, and the first to fourth gate structures 420.

For example, the lower interlayer insulating film 191 and the upper interlayer insulating film 192 may each include silicon oxide, silicon nitride, silicon oxynitride, flowable oxide (FOX), tonen silazene (TOSZ), undoped silica glass (USG), borosilica glass (BSG), phosphosilica glass (PSG), borophosphosilica glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or a combination thereof, but not limited thereto.

Figure 7:
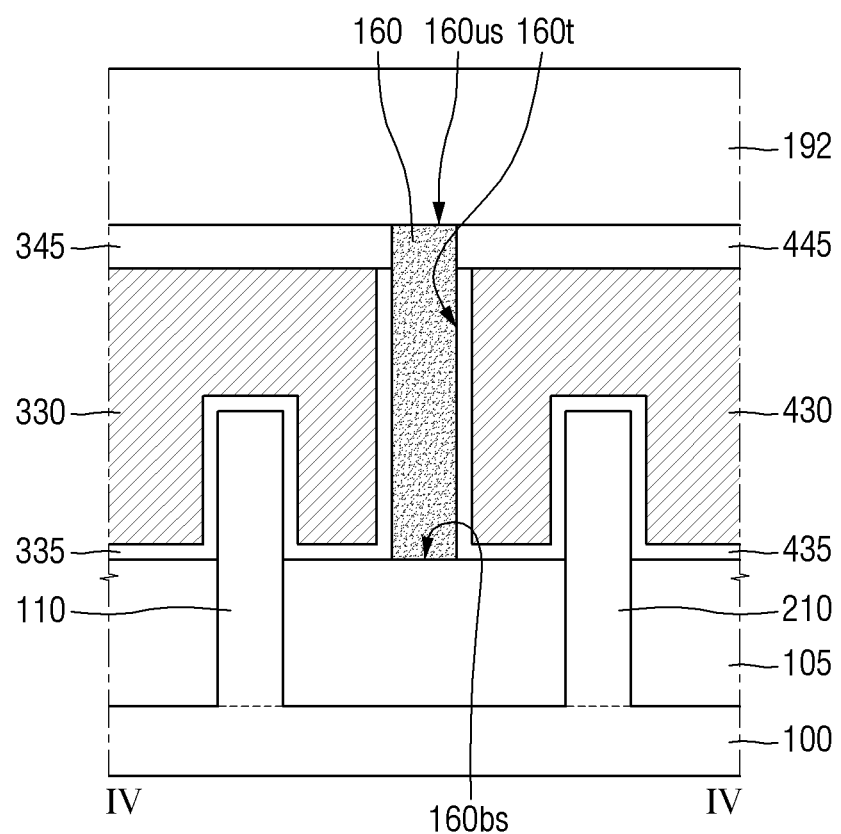
FIGS. 7 and 8 are views provided to explain a semiconductor device according to some example embodiments.
Figure 8:
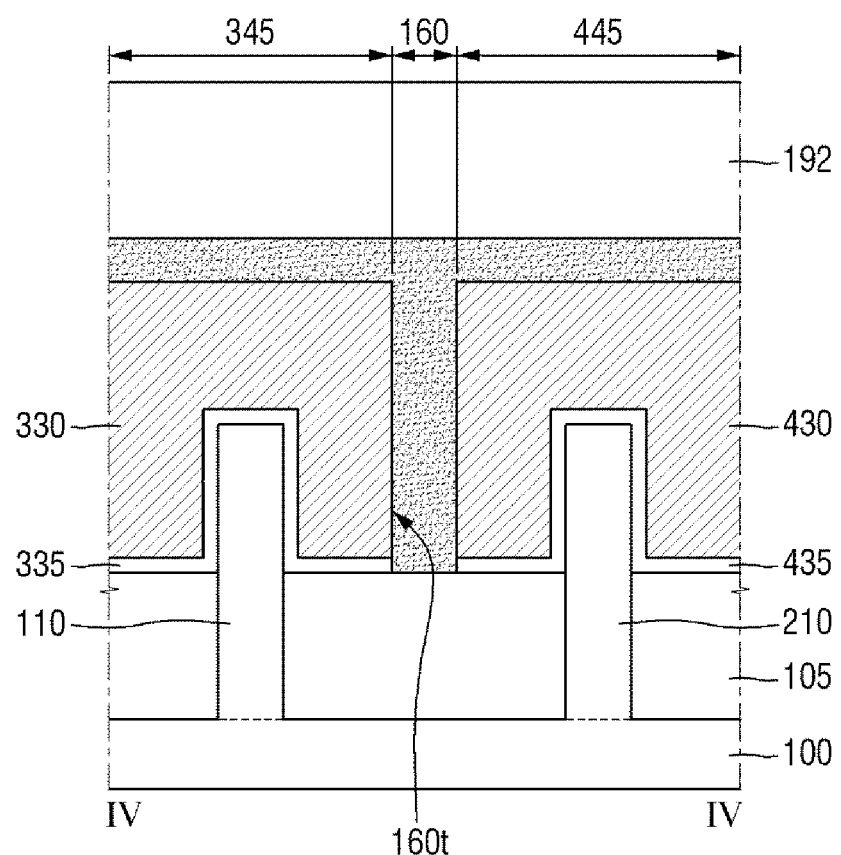
Figure 9:
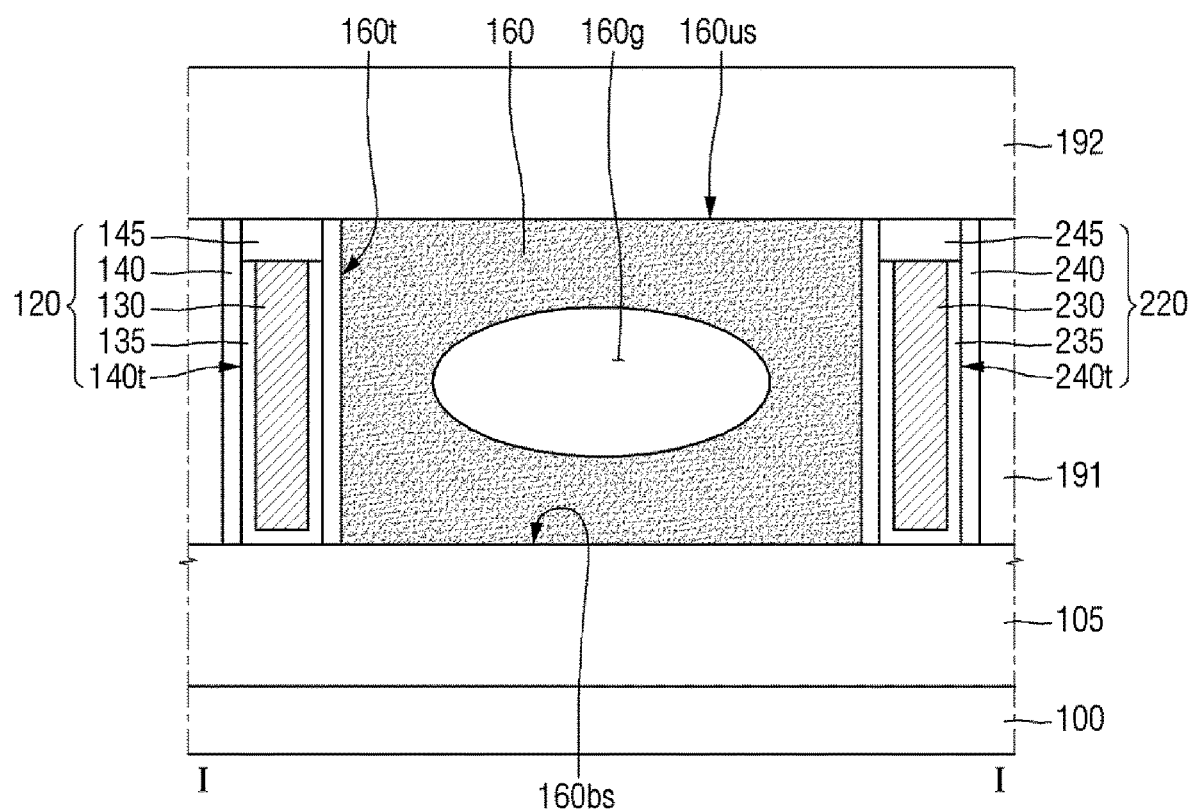
FIGS. 9 and 10 are views provided to explain a semiconductor device according to some example embodiments.
Figure 10:
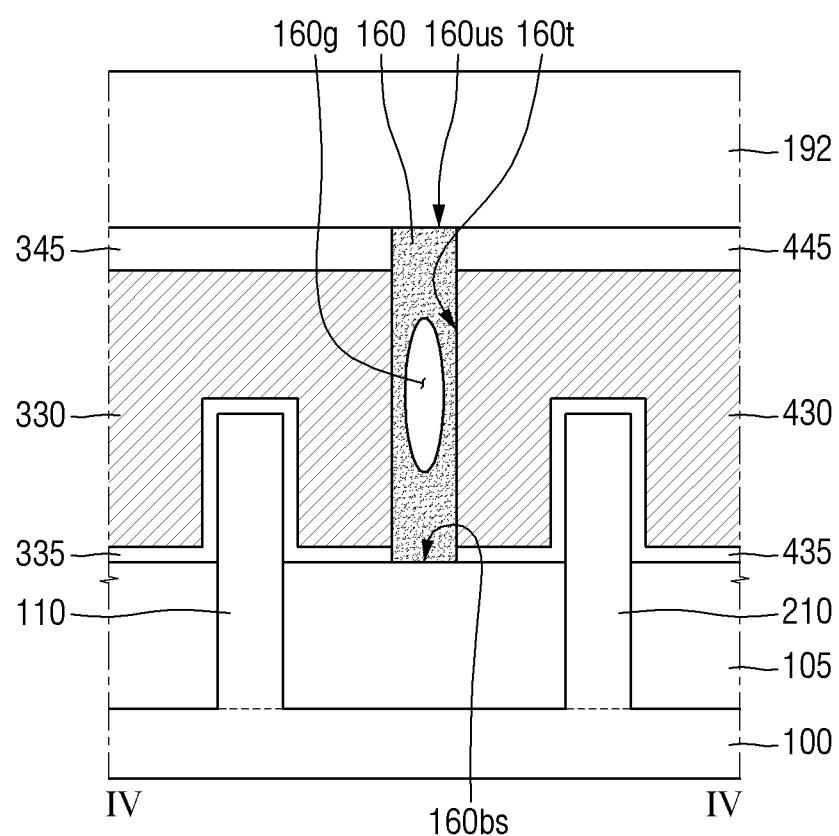
Figure 17:
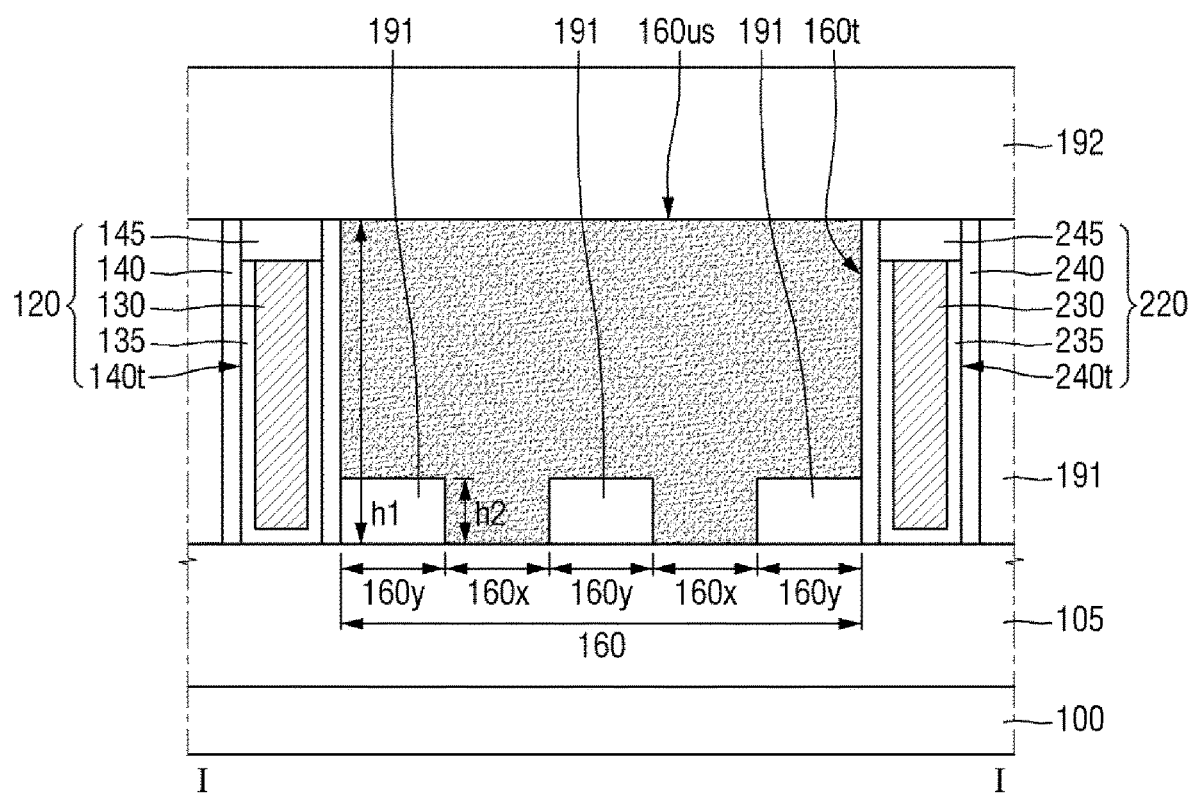
FIGS. 17 to 19 are views provided to explain a semiconductor device according to some example embodiments.
Figure 18:
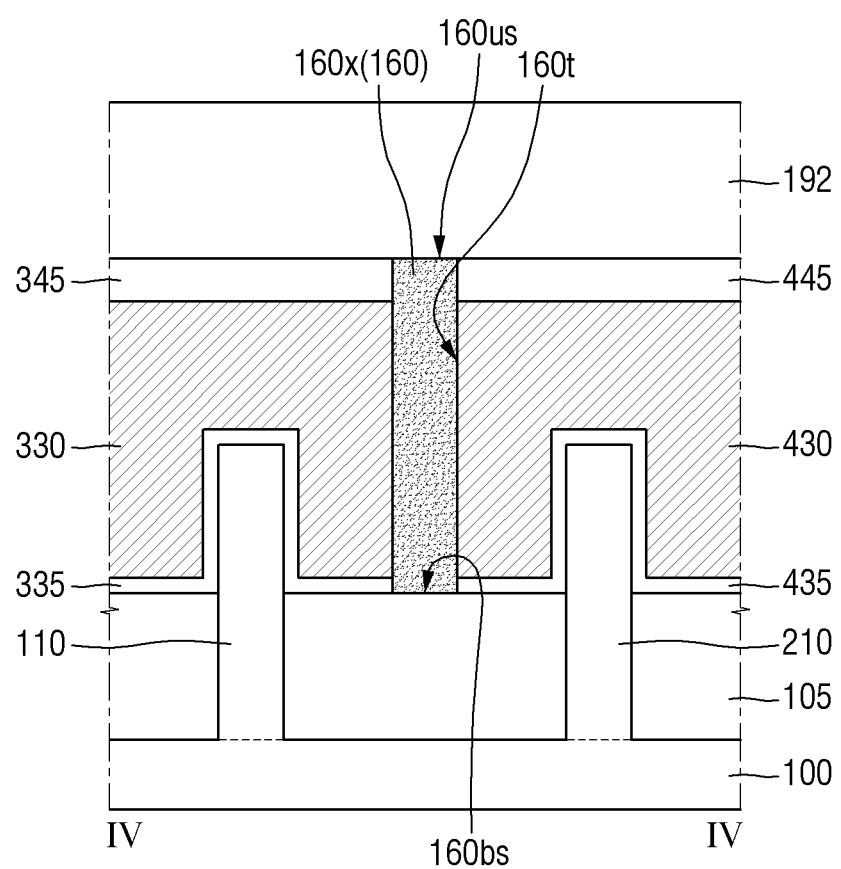
Figure 19:
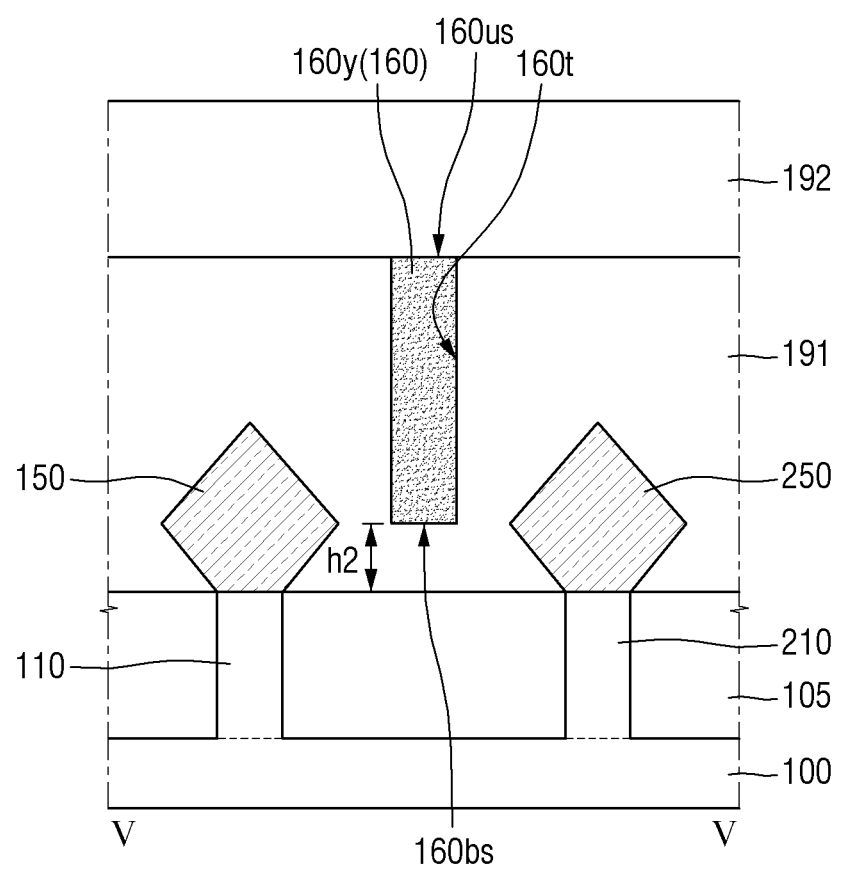
Figure 20:
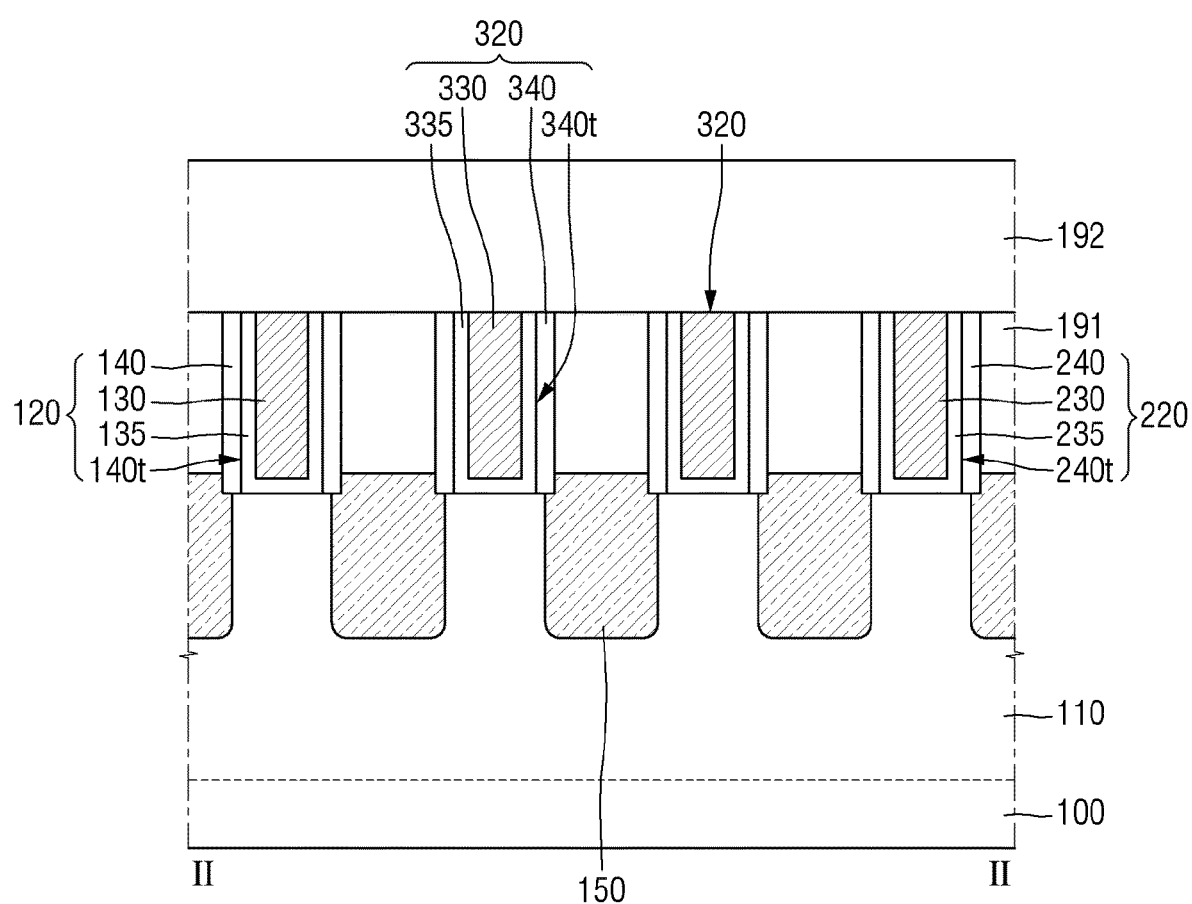
FIG. 20 is a view provided to explain a semiconductor device according to some example embodiments.

FIGS. 7 and 8 are views provided to explain a semiconductor device according to some example embodiments, respectively. FIGS. 9 and 10 are views provided to explain a semiconductor device according to some example embodiments. FIGS. 11 to 16 are views provided to explain a semiconductor device according to some example embodiments, respectively. FIGS. 17 to 19 are views provided to explain a semiconductor device according to some example embodiments. FIG. 20 is a view provided to explain a semiconductor device according to some example embodiments. For convenience of explanation, differences that are not explained above with reference to FIGS. 1 to 6 will be mainly explained below.

Referring to FIG. 7, in the semiconductor device according to example embodiments, the third gate insulating film 335 and the fourth gate insulating film 435 may be formed on the sidewall including the long side of the first gate insulating support 160. The third and fourth gate insulating films 335, 435 may be interposed between the third gate electrode 330 and the first gate insulating support 160 and between the fourth gate electrode 430 and the first gate insulating support 160.

In FIGS. 3 and 4, the third gate insulating film 335 may extend along the sidewall and the bottom surface of the third gate trench 340*t* and the sidewall of the first gate insulating support 160. The fourth gate insulating film 435 may extend along the sidewall and the bottom surface of the fourth gate trench 440*t* and the sidewall of the first gate insulating support 160.

Referring to FIG. 8, in the semiconductor device according to some example embodiments, the third capping pattern 345, the fourth capping pattern 445, and the first gate insulating support 160 may be an integral structure.

After the first isolating trench 160*t* is formed, the third and fourth capping patterns 345, 445 may be formed during forming of the first gate insulating support 160. The first and second capping patterns 145, 245 may be formed while the first gate insulating support 160 is being formed. Thus, the first gate insulating support 160 may be formed at a same level as the first to fourth capping patterns 145, 245, 345, 445.

Referring to FIGS. 9 and 10, the semiconductor device according to some example embodiments may further include an air gap 160*g* formed within the first gate insulating support 160. "Air," as described herein refers to atmospheric air, or to other gases that may fill the air gap 160*g* during a manufacturing process.

The air gap 160*g* may be surrounded by the first gate insulating support 160. The air gap 160*g* may extend longitudinally, for example, in the first direction X1 in which the long side of the first gate insulating support 160 extends, but is not limited thereto.

Figure 11:
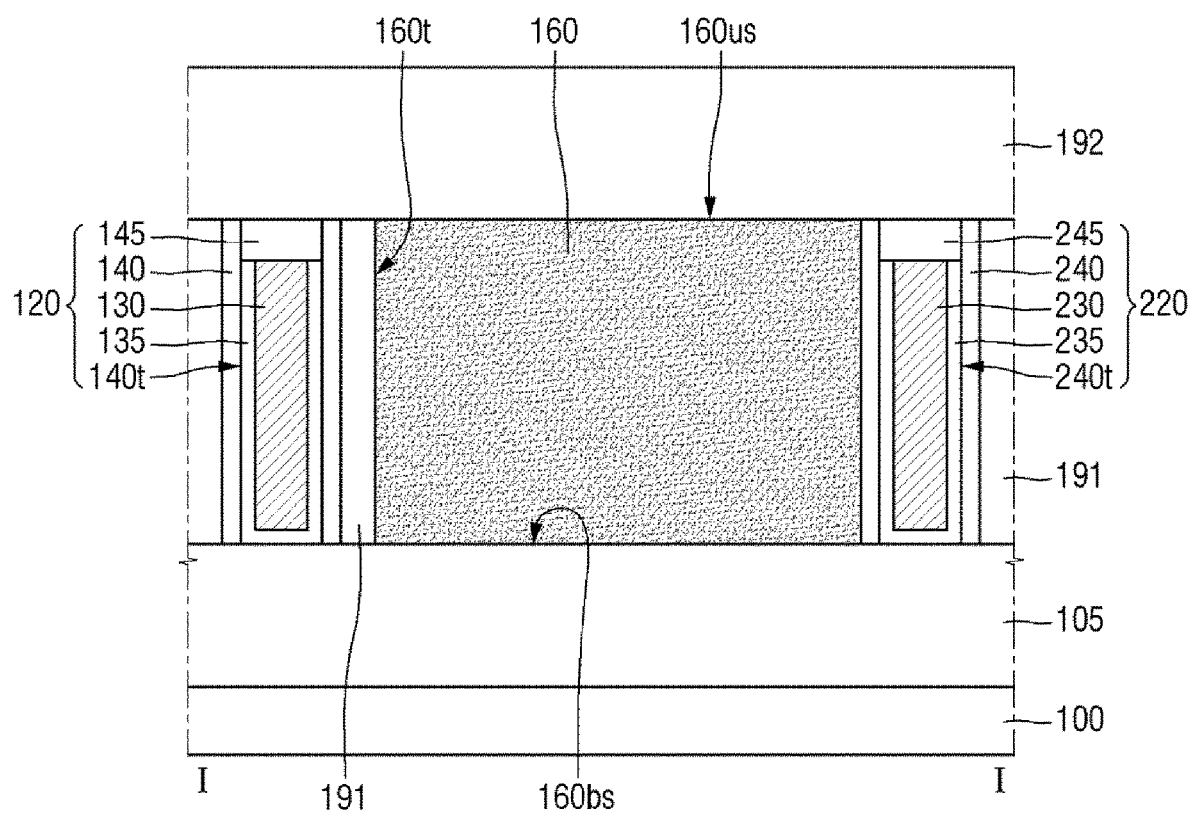
FIGS. 11 to 16 are views provided to explain a semiconductor device according to some example embodiments.
Figure 12:
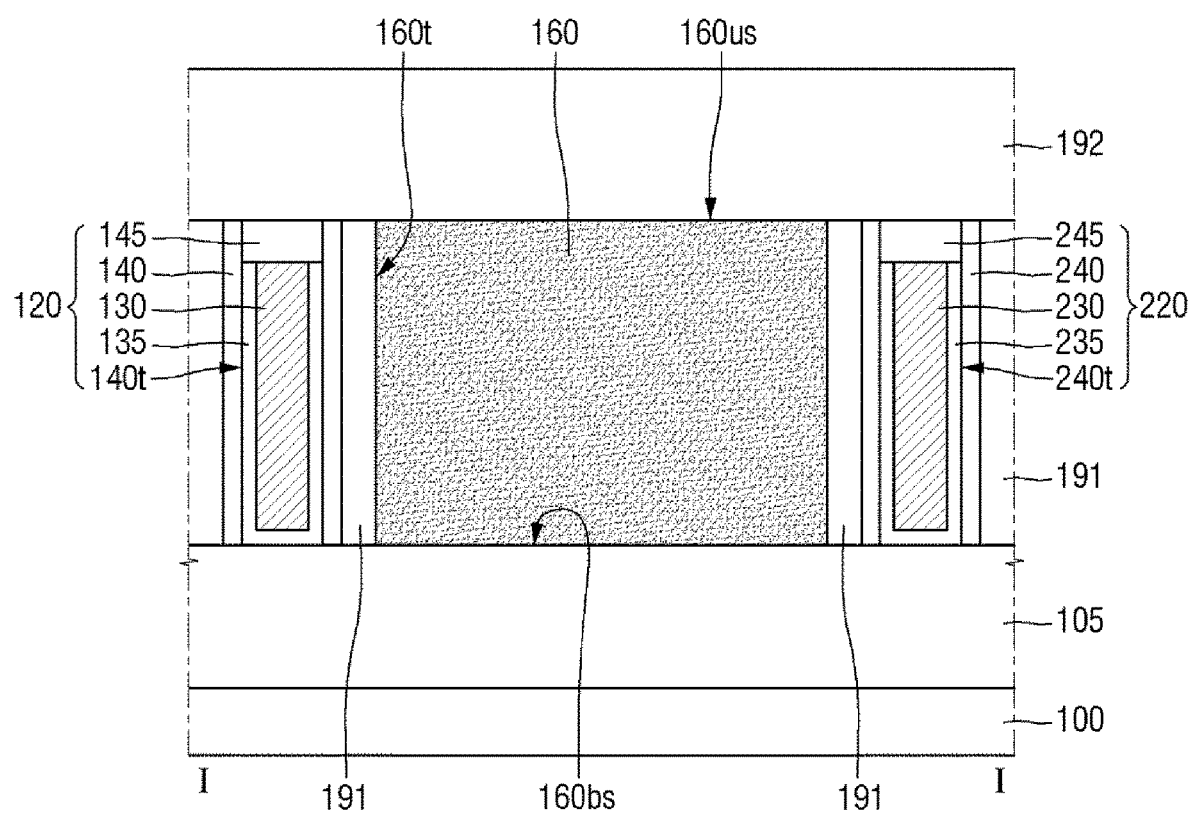

Referring to FIGS. 11 and 12, in the semiconductor device according to some example embodiments, the lower interlayer insulating film 191 may be interposed between the first gate insulating support 160 and the first gate spacer 140 and/or between the first gate insulating support 160 and the second gate spacer 240.

More specifically, the lower interlayer insulating film 191 may be interposed between the short side of the first gate insulating support 160 and the first gate spacer 140 and/or between the short side of the first gate insulating support 160 and the second gate spacer 240.

For example, the lower interlayer insulating film 191 may be interposed between the first gate insulating support 160 and the first gate spacer 140 in FIG. 11. However, the first gate insulating support 160 may be in contact with the second gate spacer 240.

For another example, in FIG. 12, the lower interlayer insulating film 191 may be interposed between the first gate insulating support 160 and the first gate spacer 140 and between the first gate insulating support 160 and the second gate spacer 240.

Figure 13:
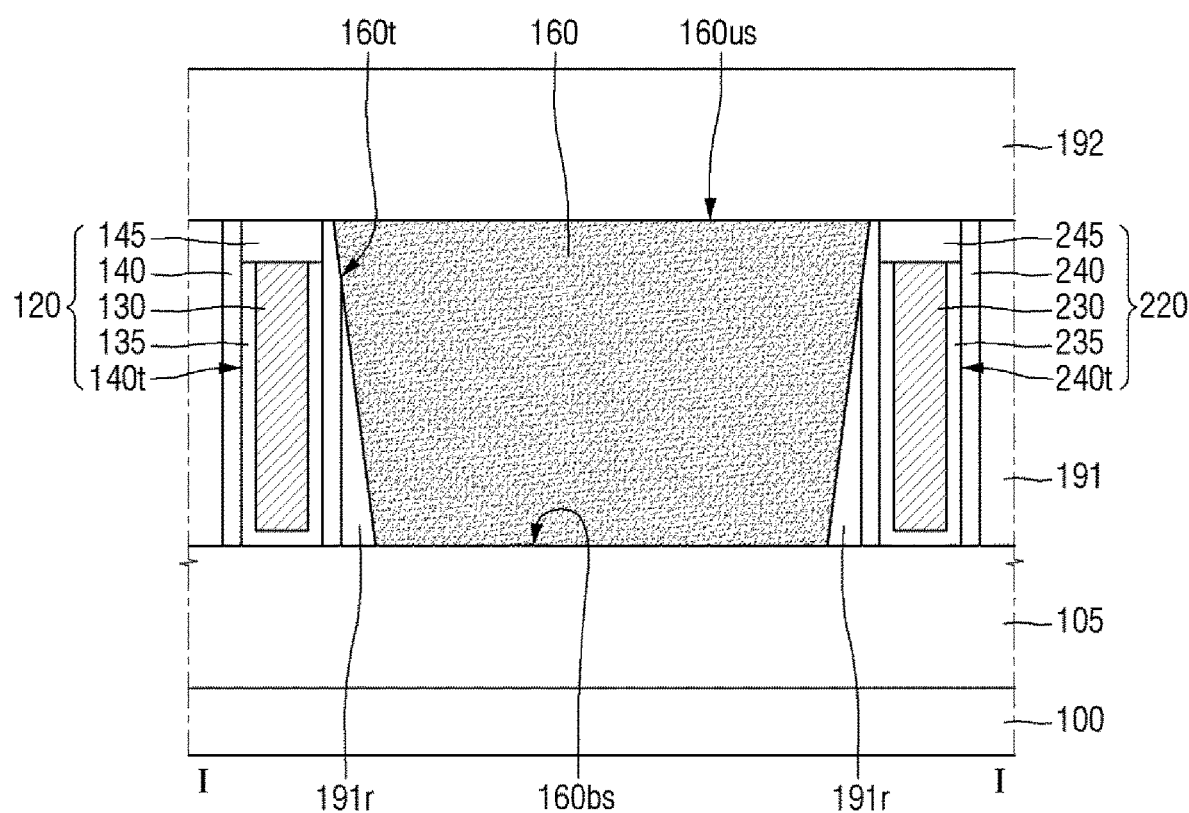

Referring to FIG. 13, in the semiconductor device according to some example embodiments, the sidewall of the first gate insulating support 160 may include an inclined surface having an acute angle with respect to the upper surface 160us of the first gate insulating support. The first gate insulating support 160 may include a portion in which a width of the first gate insulating support 160 increases as it extends farther away from the upper surface of the field insulating film 105.

The sidewall of the first gate spacer 140 and/or the sidewall of the second gate spacer 240 may include a portion having an acute angle with respect to the upper surface 160us of the first gate insulating support. An interlayer insulating pattern 191r, which is a part of the lower interlayer insulating film 191, may be interposed between the first gate insulating support 160 and the first gate structure 120 and/or between the first gate insulating support 160 and the second gate structure 220. Based on the upper surface of the field insulating film 105, a height of the interlayer insulating pattern 191r may be less than a height of the first and second gate structures 120, 220.

Figure 14:
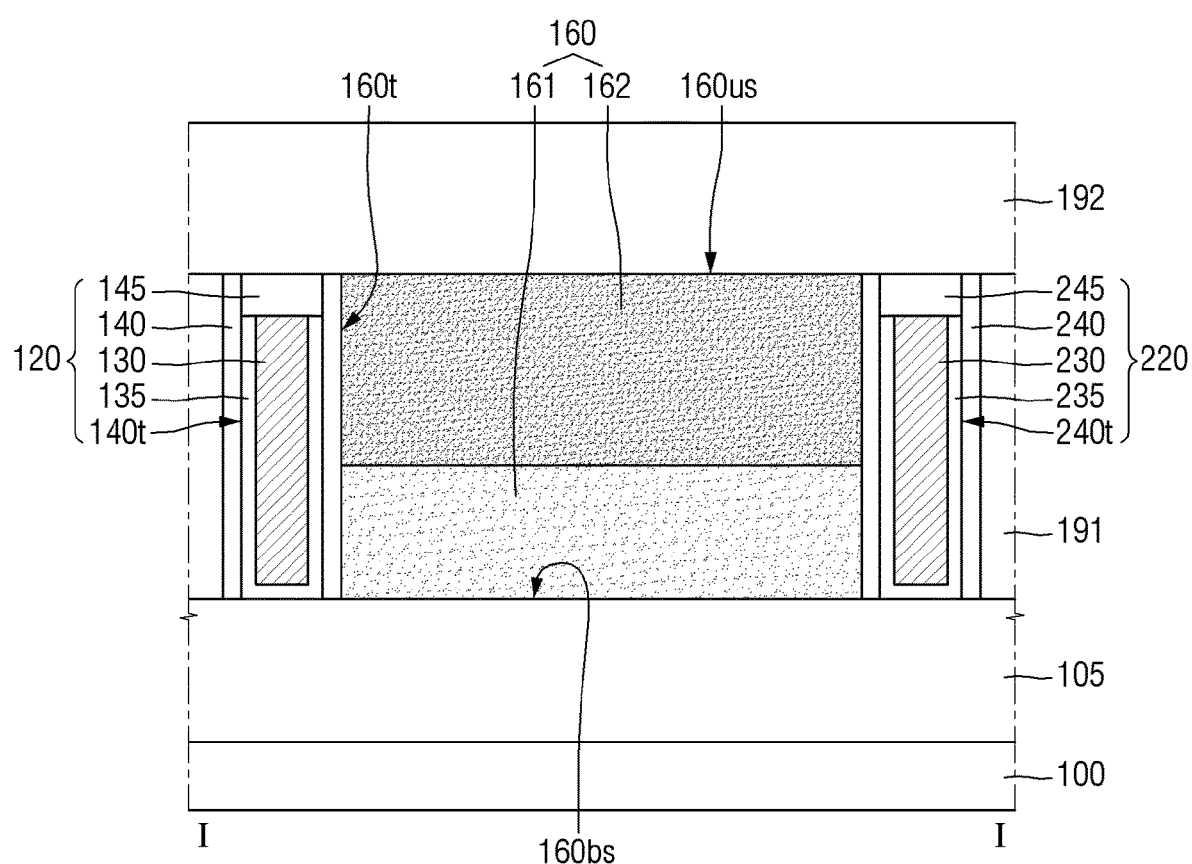

Referring to FIG. 14, in the semiconductor device according to some embodiments, the first gate insulating support 160 may include a first lower gate insulating support 161 and a first upper gate insulating support 162, which are sequentially stacked on the field insulating film 105. The upper surface of the first gate insulating support 160 may be defined by the first upper gate insulating support 162, and the bottom surface 160bs of the first gate insulating support may be defined by the first lower gate insulating support 161.

The first lower gate insulating support 161 may fill a lower portion of the first isolating trench 160t, and the first upper gate insulating support 162 may fill a portion of the first isolating trench 160t remaining not filled by the first lower gate insulating support 161. A height from the substrate 100 to the upper surface of the first and second gate electrodes 130, 230 may be greater than a height from the substrate 100 to the bottom surface of the first upper gate insulating support 162.

The first upper gate insulating support 162 may include a material having etch selectivity with respect to the lower interlayer insulating film 191. However, the first lower gate insulating support 161 may include a material having etch selectivity with respect to the lower interlayer insulating film 191, or may include a material that does not have etch selectivity.

Figure 15:
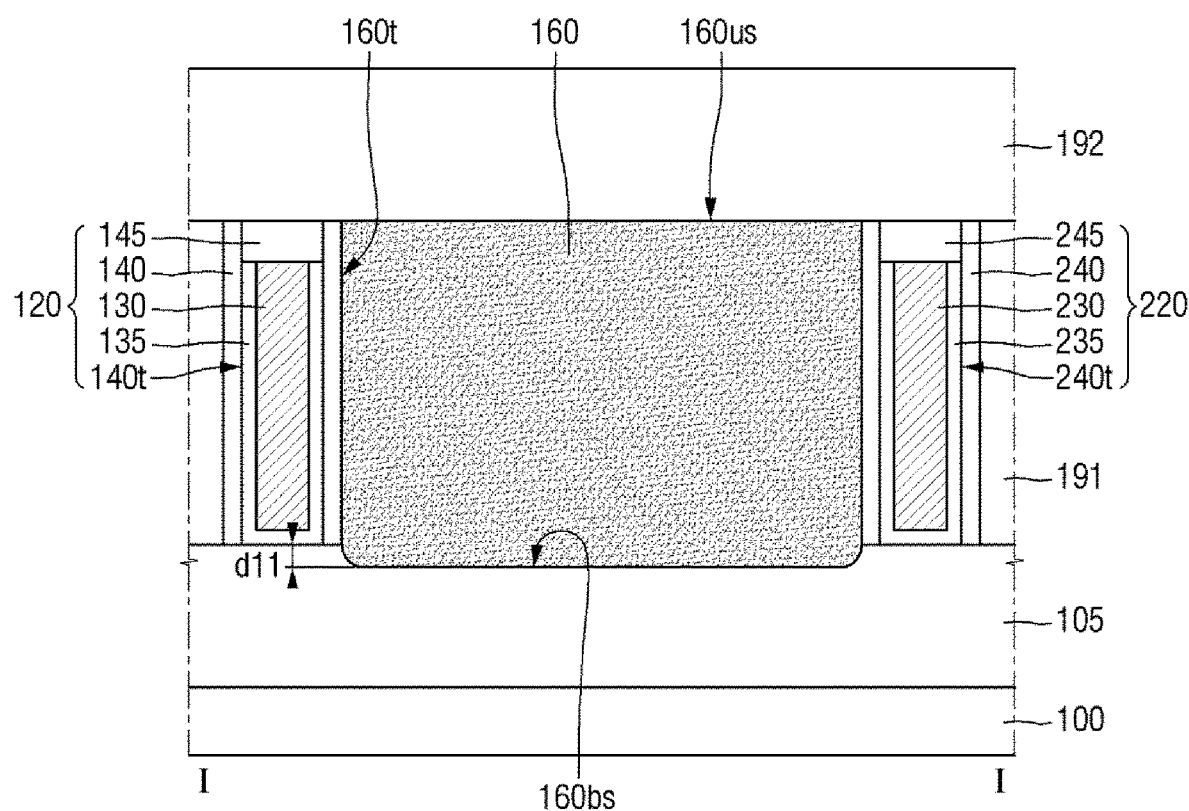

Referring to FIG. 15, in the semiconductor device according to example embodiments, at least a portion of the bottom surface 160bs of the first gate insulating support may be closer (in a vertical direction) to the substrate 100 than to the bottom surface of the first and second gate structures 120, 220.

In a cross sectional view in which the first gate insulating support 160 is cut along the first directions X1, at least a portion of the first gate insulating support 160 may be lower than the bottom surface of the first and second gate structures 120, 220. Difference between a height of the first gate insulating support 160 and a height of the first gate structure 120 may be d11.

In FIG. 15, the bottom surface 160bs of the first gate insulating support is illustrated as a flat plane, but it is not limited thereto. The bottom surface 160bs of the first gate insulating support may also include a bump.

Figure 16:
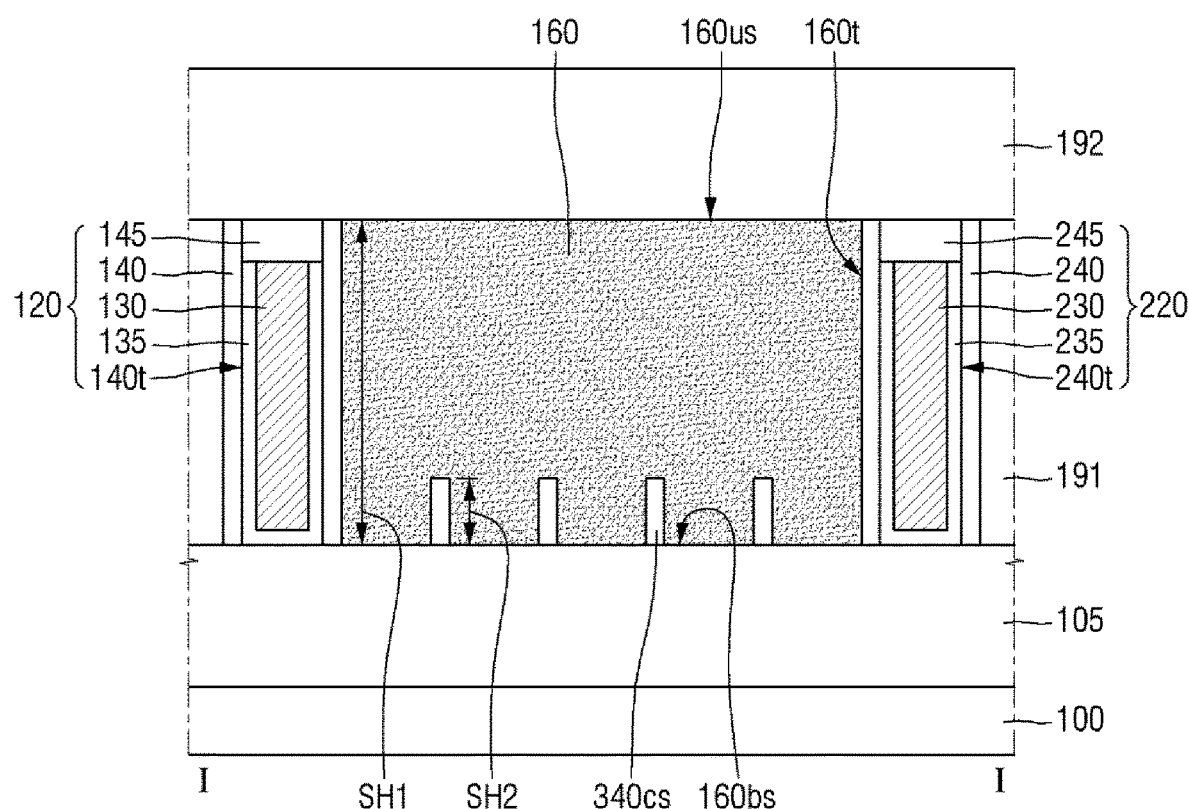

Referring to FIG. 16, the semiconductor device according to some example embodiments may further include a first connect spacer 340cs protruding from the upper surface of the field insulating film 105 between the first gate insulating support 160 and the field insulating film 105. A plurality of first connect spacers 340cs may be included.

The first connect spacer 340cs may be indented in the first gate insulating support 160. For example, the sidewall and the upper surface of the first connect spacer 340cs excluding the bottom surface of the first connect spacer 340cs may be surrounded by the first gate insulating support 160.

A height SH2 of the first connect spacer 340cs may be less than a height SH1 of the first and second gate spacers 140, 240. Because the bottom surface of the first connect spacer 340cs and the bottom surfaces of the first and second gate spacers 140, 240 may be in contact with the field insulating film 105, the upper surfaces of the first and second gate spacers 140, 240 may be higher than the upper surface of the first connect spacer 340cs. Further, the first connect spacer 340cs may connect the third gate spacer 340 and the fourth gate spacer 440. For example, the first connect spacer 340cs may be in contact with the third gate spacer 340 and the fourth gate spacer 440. In one embodiment, the first connect spacer 340cs may include the same material as the third and fourth gate spacers 340, 440.

Referring to FIGS. 17 to 19, in the semiconductor device according to some example embodiments, a portion of the lower interlayer insulating film 191 may be interposed between the first gate insulating support 160 and the field insulating film 105.

More specifically, the first gate insulating support 160 may include a first portion 160x being in contact with the third and fourth gate structures 320, 420 and a second portion 160y not being in contact with the third and fourth gate structures 320, 420.

The first portion 160x of the first gate insulating support may be positioned between the third gate structure 320 and the fourth gate structure 420. The second portion 160y of the first gate insulating support may be positioned between the adjacent first and third gate structures 120, 320, between the adjacent third gate structure 320, and between the adjacent second and third gate structures 220, 320.

The lower interlayer insulating film 191 may be interposed between the second portion 160y of the first gate insulating support and the field insulating film 105.

A height h2 from the field insulating film 105 to the bottom surface of the second portion 160y of the first gate insulating support may be less than a height h1 from the field insulating film 105 to the upper surface of the first and second gate electrodes 130, 230.

Referring to FIG. 20, in the semiconductor device according to some example embodiments, the upper surfaces of the first to third gate electrodes 130, 230, 330 may be coplanar with the upper surface of the lower interlayer insulating film 191. Likewise, the fourth gate electrode (see 420 of FIG. 4) may be coplanar with the upper surface of the lower interlayer insulating film 191.

Further, the upper surfaces of the first to fourth gate electrodes 120, 230, 330, 430 may be coplanar with the upper surface of the first gate insulating support (see 160 of FIG. 2).

The first to fourth gate structures 120, 220, 320, 420 may not include the capping patterns 145, 245, 345, 445, respectively.

Figure 21:
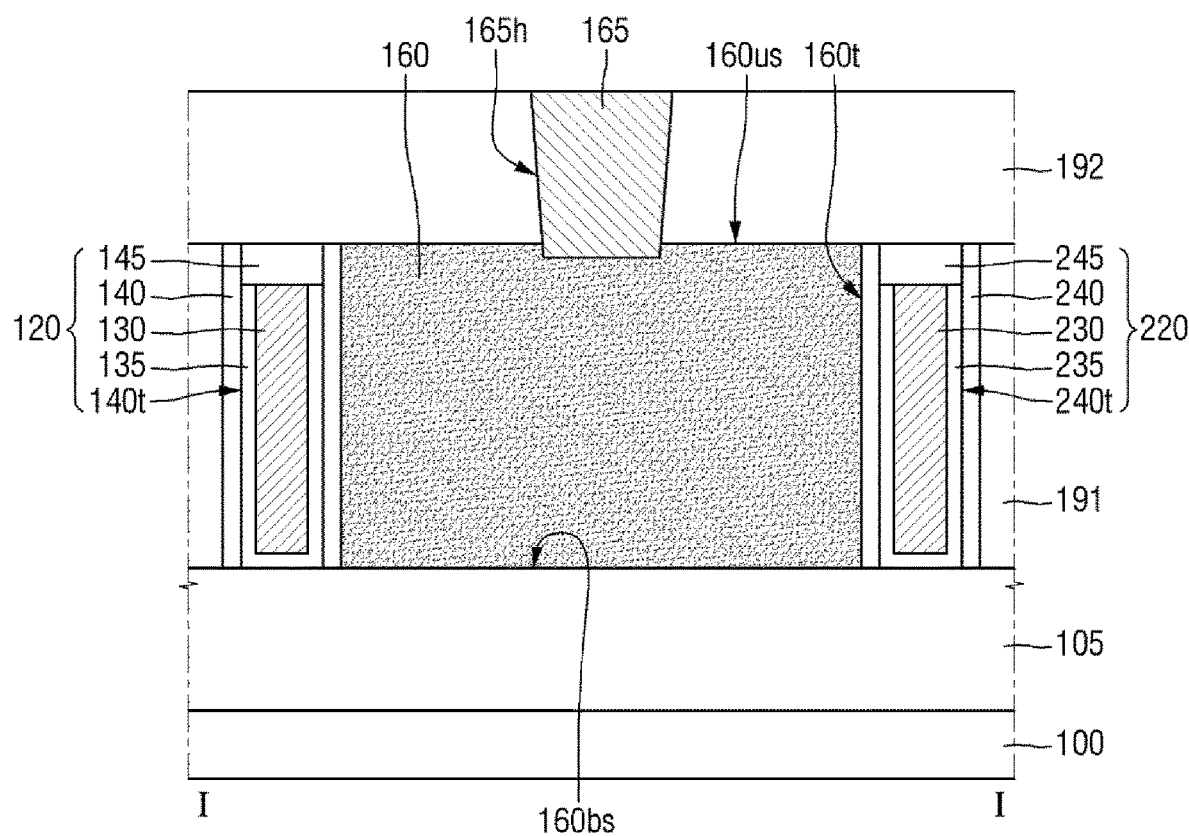
FIGS. 21 and 22 are views provided to explain a semiconductor device according to some example embodiments.
Figure 22:
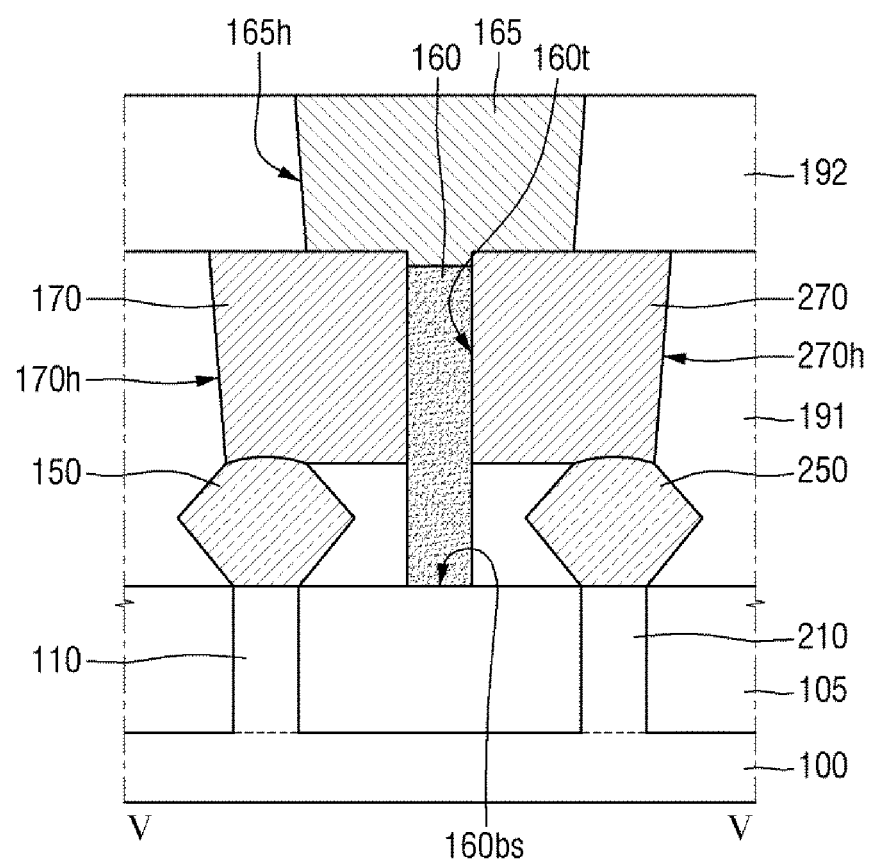

FIGS. 21 and 22 are views provided to explain a semiconductor device according to some example embodiments. For convenience of explanation, differences that are not explained above with reference to FIGS. 1 to 6 will be mainly explained below.

Referring to FIGS. 21 and 22, the semiconductor device according to some example embodiments may further include a conductive jumper 165 electrically connecting the first epitaxial pattern 150 and the second epitaxial pattern 250. The conductive jumper 165 may be formed on the first gate insulating support 160 and may intersect the first gate insulating support 160.

A first lower contact 170 connected with the first epitaxial pattern 150 and a second lower contact 270 connected with the second epitaxial pattern 250 may be formed within the lower interlayer insulating film 191. The first lower contact 170 may fill a first lower contact hole 170h exposing the first epitaxial pattern 150, and the second lower contact 270 may fill a second lower contact hole 270h exposing the second epitaxial pattern 250. The first lower contact 170 and the second lower contact 270 may be isolated by the first gate insulating support 160 disposed between the first epitaxial pattern 150 and the second epitaxial pattern 250.

The conductive jumper 165 may connect the first lower contact 170 and the second lower contact 270 which are isolated by the first gate insulating support 160. The conductive jumper 165 may be formed within the upper interlayer insulating film 192. The upper interlayer insulating film 192 may include a jumper hole 165h which exposes the first lower contact 170 and the second lower contact 270, and the first gate insulating support 160. During the formation of the jumper hole 165h, a portion of the first gate insulating support 160 may be recessed, but the formation is not limited thereto. The conductive jumper 165 may be formed within the jumper hole 165h. For example, the conductive jumper 165 may be formed by using Damascene process. The upper surface of the conductive jumper 165 and the upper surface of the upper interlayer insulating film 192 may be coplanar.

Each of the first and second lower contacts 170, 270 and the conductive jumper 165 may include, for example, at least one of tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), rhodium (Rh), aluminum (Al), copper (Cu), cobalt (Co) and poly silicon (poly-Si).

Differently from FIG. 22, a portion of the first lower contact 170 and a portion of the second lower contact 270, which are exposed by the jumper hole 165h, may be recessed.

Figure 23:
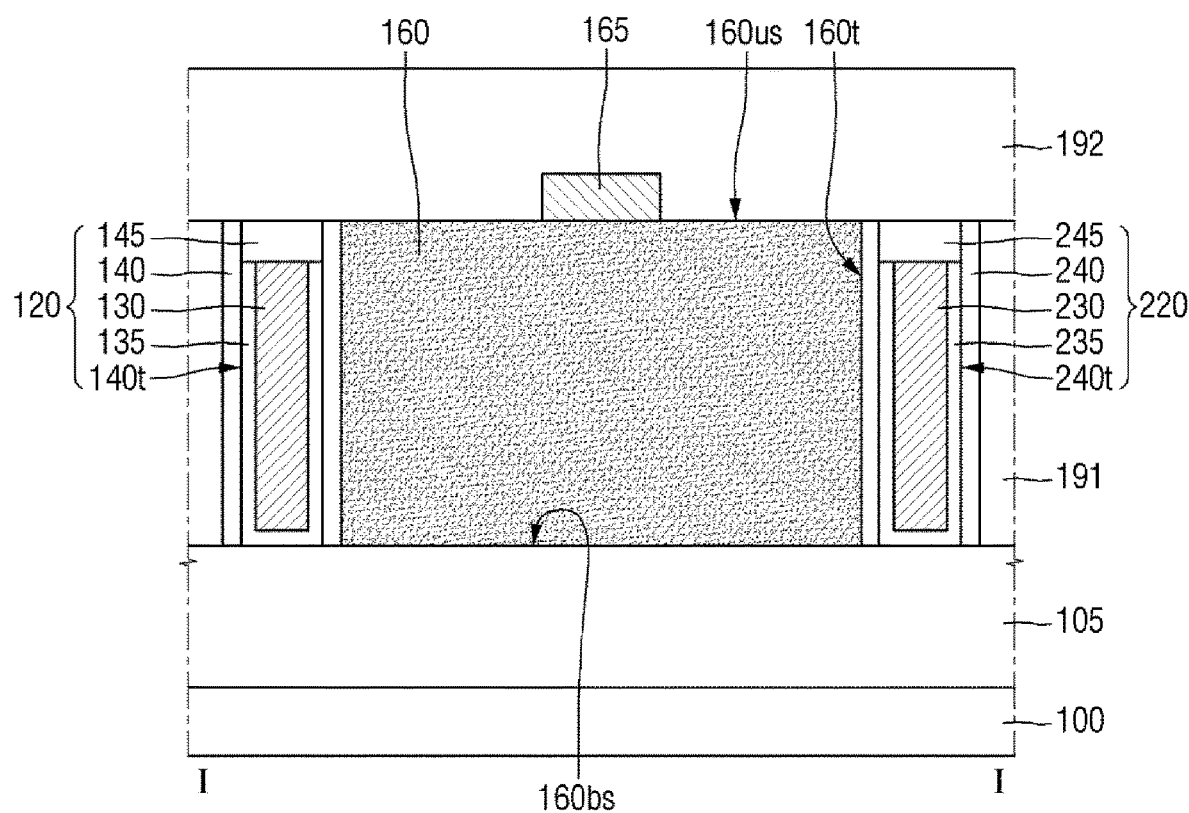
FIGS. 23 and 24 are views provided to explain a semiconductor device according to some example embodiments.
Figure 24:
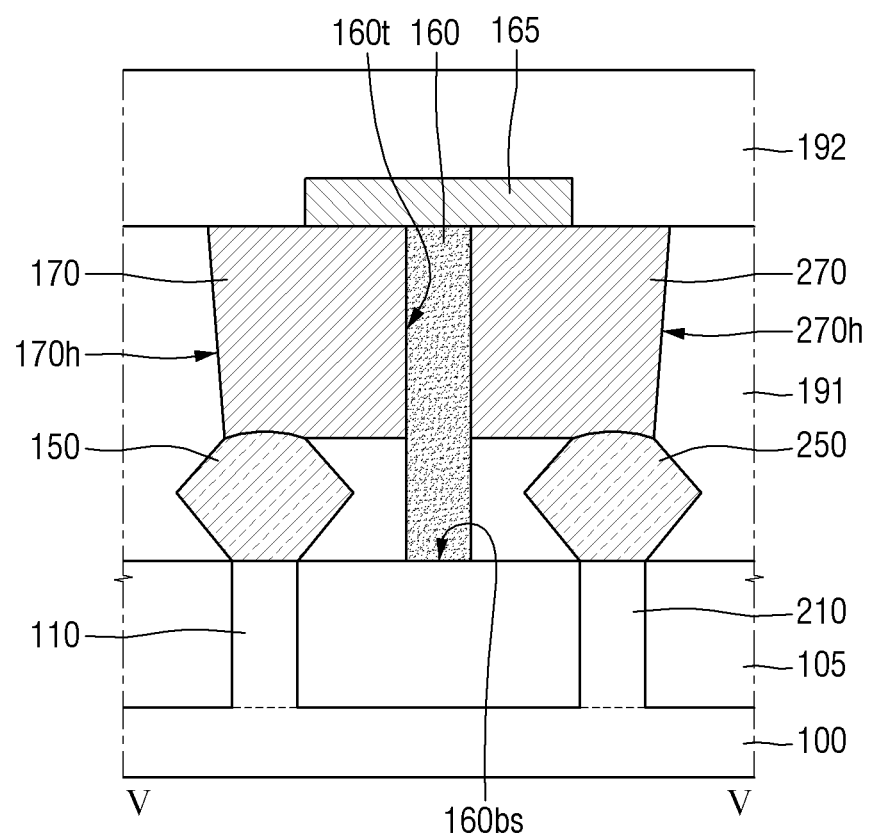

FIGS. 23 and 24 are views provided to explain a semiconductor device according to some example embodiments. For convenience of explanation, differences that are not explained above with reference to FIGS. 21 and 22 will be mainly explained below.

Referring to FIGS. 23 and 24, in the semiconductor device according to some example embodiments, the upper interlayer insulating film 192 may cover the conductive jumper 165.

After the formation of the conductive jumper 165 connecting the first and second lower contacts 170, 270, the upper interlayer insulating film 192 covering the conductive jumper 165 may be formed.

Figure 25:
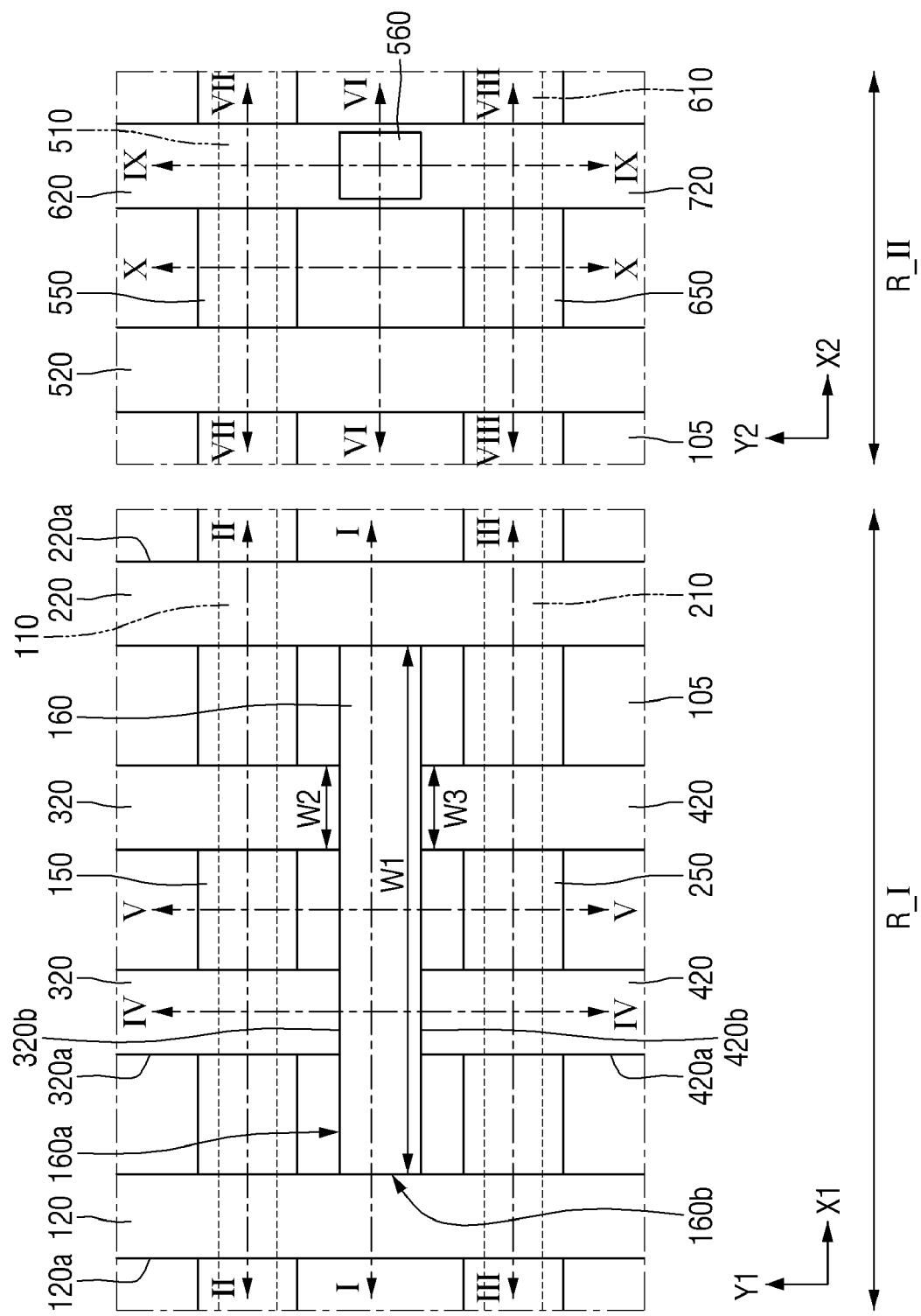
FIG. 25 is a top view provided to explain a semiconductor device according to some example embodiments.
Figure 26:
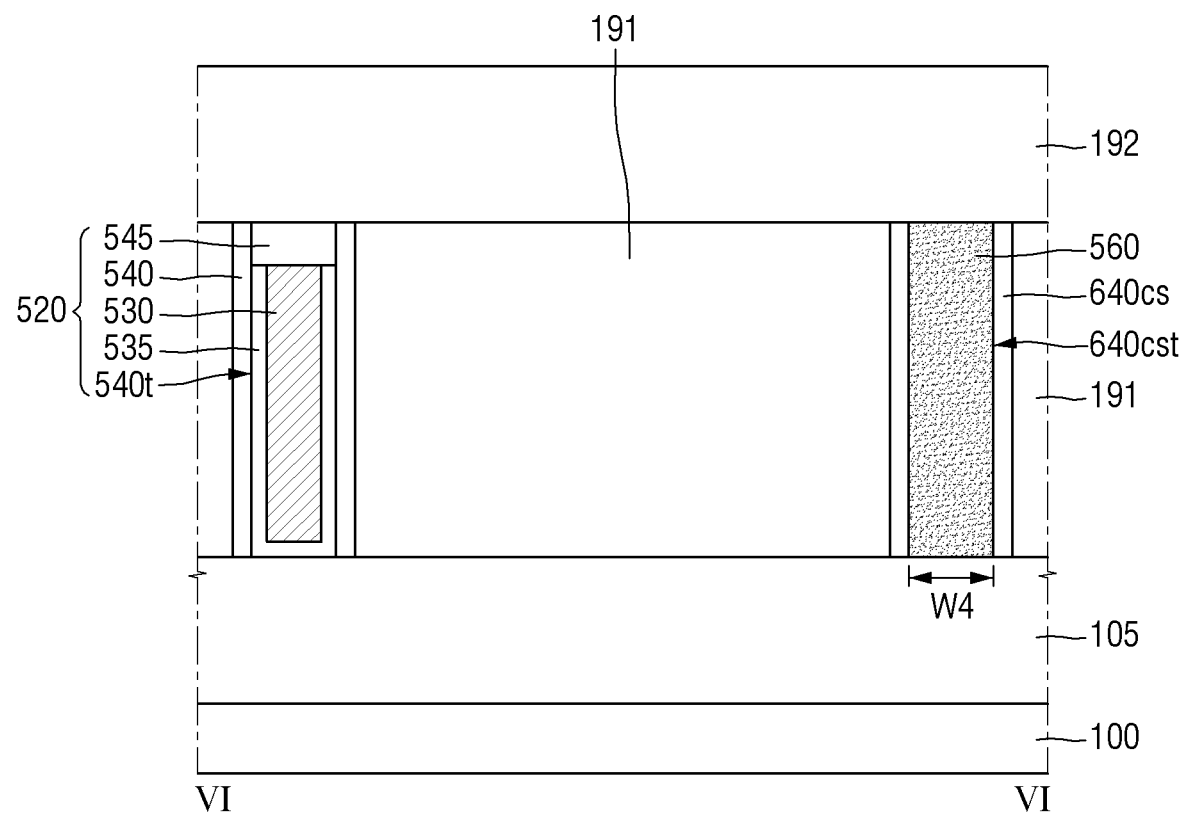
FIGS. 26 to 30 are respective cross sectional views taken on lines VI-VI, VII-VII, VIII-VIII, IX-IX and X-X of FIG. 25.
Figure 27:
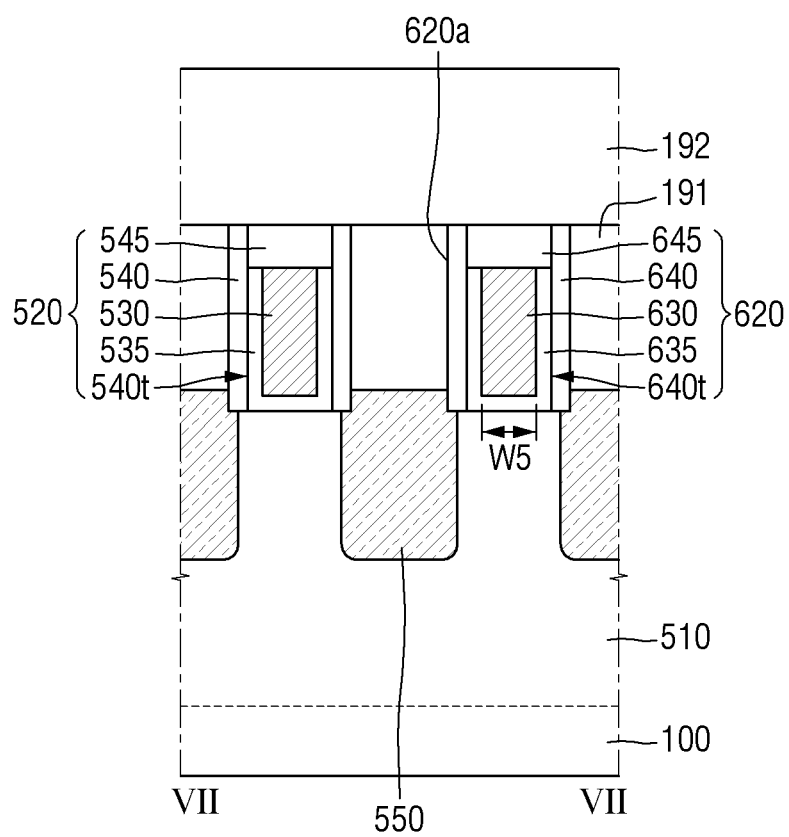
Figure 28:
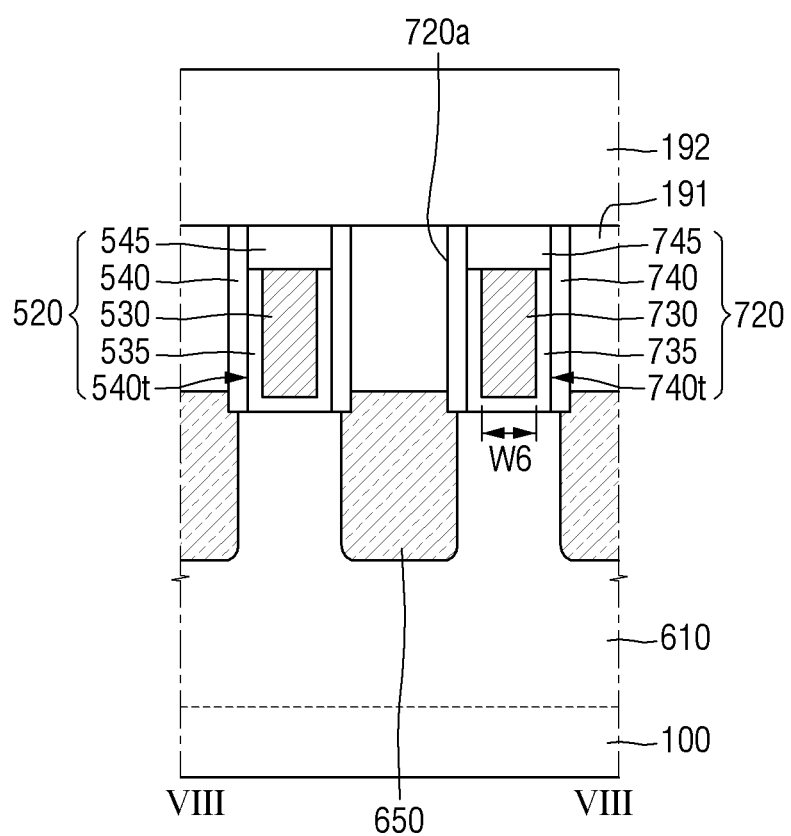
Figure 29:
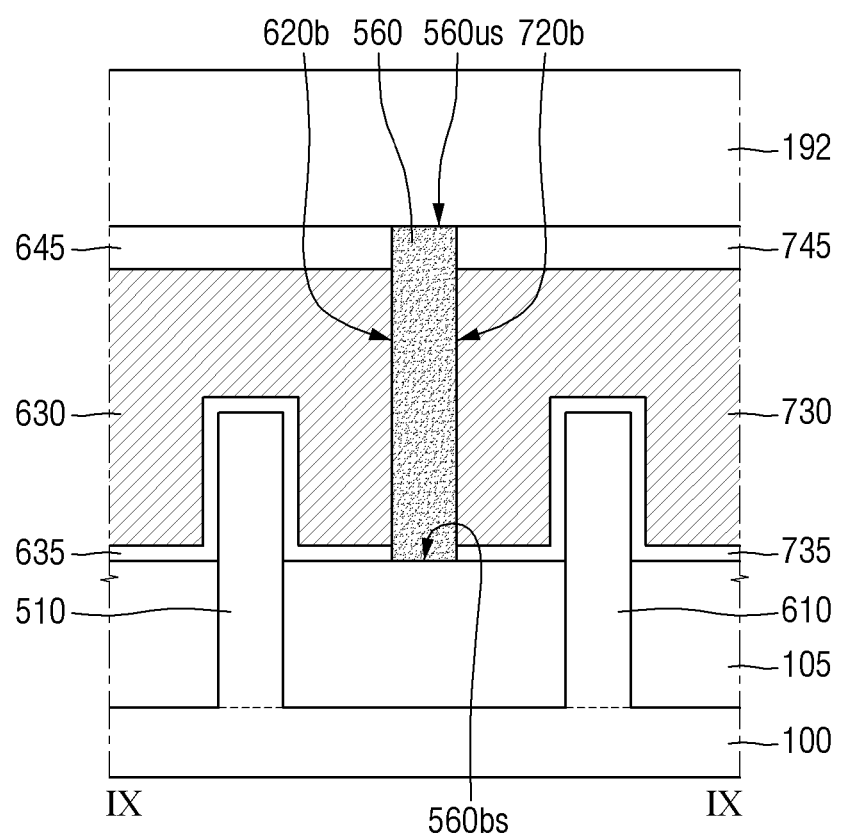
Figure 30:
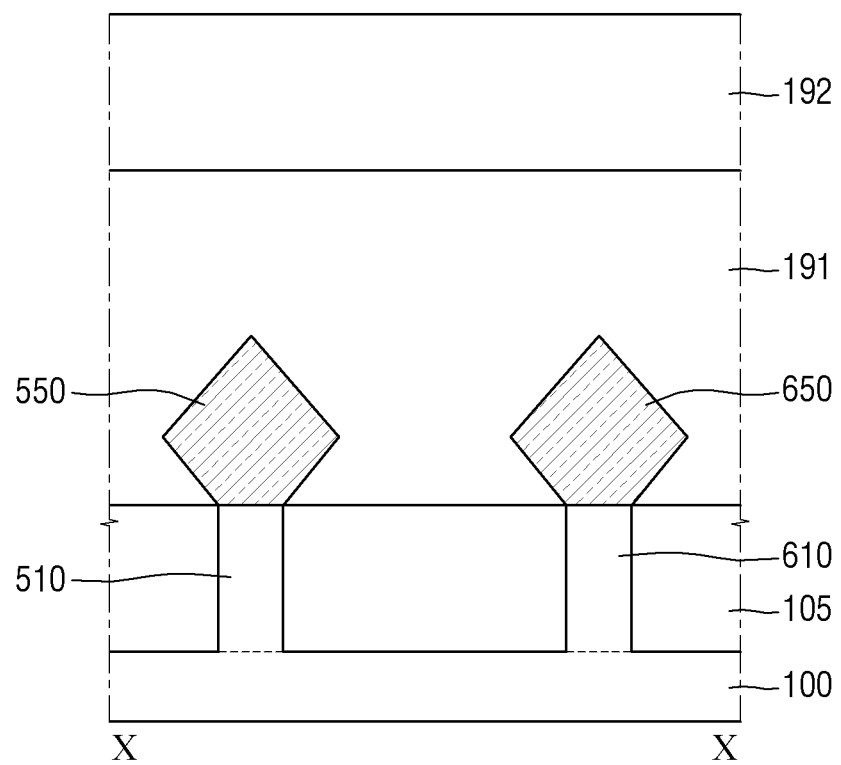

FIG. 25 is a top view provided to explain a semiconductor device according to some example embodiments. FIGS. 26 to 30 are respective cross sectional views taken on lines VI-VI, VII-VII, VIII-VIII, IX-IX and X-X of FIG. 25. For convenience of explanation, differences that are not explained above with reference to FIGS. 1 to 6 will be mainly explained below.

For reference, because a first region R_I of FIG. 25 may be substantially same as that described above with reference to FIGS. 1 to 6, following description will be made based on a second region R_II of FIG. 25. As such, FIG. 25 may include all of the features of FIGS. 1 to 6 and may also have additional features.

Further, the cross sectional views taken on lines I-I, II-II, IV-IV, and V-V of FIG. 25 may be substantially same as any of FIGS. 2 to 24. As such, FIG. 25 may include all of the features of the different embodiments shown in FIG. 1 or 7-24, and may also have additional features.

Referring to FIGS. 25 to 30, the semiconductor device according to some example embodiments may include the first to fourth fin-type patterns 110, 210, 510, 610, the first to sixth gate structures 120, 220, 320, 420, 520, 620, the first gate insulating support 160, and the second gate insulating support 560.

The substrate 100 may include the first region R_I and the second region R_II. The first region R_I and the second region R_II may be the regions spaced apart from each other, or regions connected to each other. In the semiconductor device according to some example embodiments, the first region R_I may be a memory region such as an SRAM forming region and the second region R_II may be a logic region or an I/O region.

In the first region R_I, the first fin-type pattern 110, the second fin-type pattern 210, the first gate structure 120, the second gate structure 220, the third gate structure 320, the fourth gate structure 420, and the first gate insulating support 160 may be formed.

In the second region R_II, the third fin-type pattern 510, the fourth fin-type pattern 610, the fifth gate structure 520, the sixth gate structure 620 and the second gate insulating support 560 may be formed.

The third and fourth fin-type patterns 510, 610 may protrude from the substrate 100. The third and fourth fin-type patterns 510, 610 may be defined by the field insulating film 105. The third and fourth fin-type patterns 510, 610 may each extend longitudinally in a third direction X2. Like the first fin-type pattern 110, the third and fourth fin-type patterns 510, 610 may include a variety of semiconductor materials. However, in explaining the semiconductor device according to some example embodiments, it is assumed that the third and fourth fin-type patterns 510, 610 are silicon fin-type active patterns that include silicon.

The fifth gate structure 520 may extend in a fourth direction Y2 on the field insulating film 105. The fifth gate structure 520 may be formed on the third and fourth fin-type patterns 510, 610, while intersecting the third and fourth fin-type patterns 510, 610.

The sixth gate structure 620 and a seventh gate structure 720 may be each disposed to be arranged in the third direction X2 to the fifth gate structure 520. The sixth gate structure 620 and the seventh gate structure 720 may extend in the fourth direction Y2 on the field insulating film 105. The sixth gate structure 620 may be formed on the third fin-type pattern 510, while intersecting and crossing over the third fin-type pattern 510. The seventh gate structure 720 may be formed on the fourth fin-type pattern 610, while intersecting and crossing over the fourth fin-type pattern 610.

A long side 620a of the sixth gate structure and a long side 720a of the seventh gate structure may each extend in the fourth direction Y2, and face a long side of the fifth gate structure 520. A short side 620b of the sixth gate structure and a short side 720b of the seventh gate structure may extend in the third direction X2, and face each other.

Each of the fifth to seventh gate structures 520, 620, 720 may include the gate electrodes 530, 630, 730, the gate insulating films 535, 635, 735, the gate spacers 540, 640, 740, the gate trenches 540t, 640t, 740t defined by the gate spacers 540, 640, 740, and the capping patterns 545, 645, 745.

The fifth gate electrode 530 may be formed on the third fin-type pattern 510, the field insulating film 105, and the fourth fin-type pattern 610. The sixth gate electrode 630 may be formed on the third fin-type pattern 510 and the field insulating film 105, and the seventh gate electrode 730 may be formed on the fourth fin-type pattern 610 and the field insulating film 105.

The fifth to seventh gate spacers 540, 640, 740 may be respectively formed on the sidewalls of the fifth to seventh gate electrodes 530, 630, 730.

The fifth gate insulating film 535 may be formed on the third and fourth fin-type patterns 510, 610, and the field insulating film 105. The sixth gate insulating film 635 may be formed on the third fin-type pattern 510 and the field insulating film 105, and the seventh gate insulating film 735 may be formed on the fourth fin-type pattern 610 and the field insulating film 105.

The fifth to seventh capping patterns 545, 645, 745 may be respectively formed on the gate electrodes 530, 630, 730. The fifth to seventh capping patterns 545, 645, 745 may each fill the gate trenches 540t, 640t, 740t remaining after the formation of the gate electrodes 530, 630, 730.

A third epitaxial pattern 550 may be formed on at least one side of the sixth gate structure 620. A fourth epitaxial pattern 650 may be formed on at least one side of the seventh gate structure 720. The third epitaxial pattern 550 may be formed on the third fin-type pattern 510, and the fourth epitaxial pattern 650 may be formed on the fourth fin-type pattern 610. The third epitaxial pattern 550 and the fourth epitaxial pattern 650, which are corresponding to each other, may be arranged in the fourth direction Y2.

A second connect spacer 640cs may be disposed between the sixth gate structure 620 and the seventh gate structure 720. The second connect spacer 640cs may connect the sixth gate spacer 640 and the seventh gate spacer 740. The second connect spacer 640cs may define the second isolating trench 640cst.

The second insulating support 560 may be disposed between the sixth gate structure 620 and the seventh gate structure 720. The second gate insulating support 560 may be disposed between the short side 620b of the sixth gate structure and the short side 720b of the seventh gate structure.

The second gate insulating support 560 may be formed within the second isolating trench 640cst. The second gate insulating support 560 may be disposed on the field insulating film 105 between the sixth gate electrode 630 and the seventh gate electrode 730. The second gate insulating support 560 may isolate the sixth gate electrode 630 and the seventh gate electrode 730. The sixth gate electrode 630 and the seventh gate electrode 730 may be in contact with the second gate insulating support 560.

The sixth and seventh gate trenches 640t, 740t and the second isolation trench 640cst may be one single connect trench which longitudinally extends in the fourth direction Y2. Further, the sixth gate electrode 630, the seventh gate electrode 730, and the second gate insulating support 560 may be formed within the connect trench. Because of the above, a width W4 of the second gate insulating support 560 in the third direction X2 may be substantially the same as a width W5 of the sixth gate electrode 630 in the third direction X2, and as a width W6 of the seventh gate electrode 730 in the third direction X2. Further, the first gate insulating support 560 may also not be disposed between the third and fourth epitaxial patterns 550, 650 that face each other in the fourth direction Y2.

The upper surface 560us of the second gate insulating support may be coplanar with the upper surface of the lower interlayer insulating film 191 and the upper surfaces of the fifth to seventh gate structures 520, 620, 720. In a cross sectional view in the fourth direction Y2 of FIG. 29, a height from the substrate 100 to the bottom surface 560bs of the second gate insulating support may be less than or equal to a height from the substrate 100 to the bottom surfaces of the sixth to seventh gate structures 620, 720.

The second gate insulating support 560 may include a material having etch selectivity with respect to the lower interlayer insulating film 191.

Figure 31:
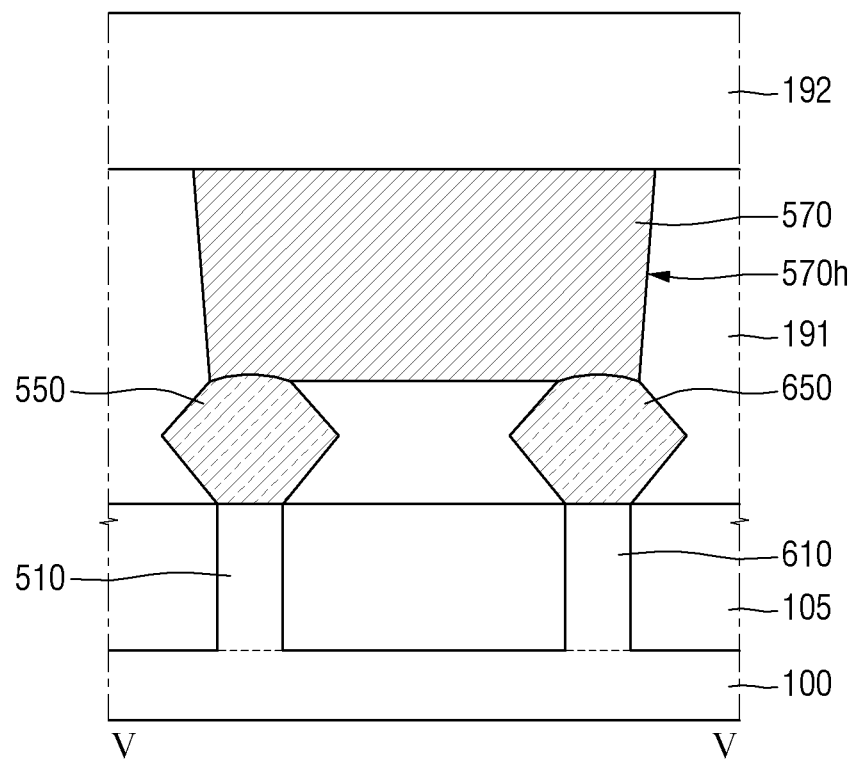
FIG. 31 is a view provided to explain a semiconductor device according to some example embodiments.

FIG. 31 is a view provided to explain a semiconductor device according to some example embodiments. For convenience of explanation, differences that are not explained above with reference to FIGS. 25 to 30 will be mainly explained below.

Referring to FIG. 31, the semiconductor device according to some example embodiments may additionally include a third lower contact 570 connected with the third epitaxial pattern 550 and the fourth epitaxial pattern 650.

The third lower contact 570 may be formed within the third lower contact hole 570h which is formed within the lower interlayer insulating film 191. The third lower contact 570 may extend across the third epitaxial pattern 550 and the fourth epitaxial pattern 650.

Figure 32:
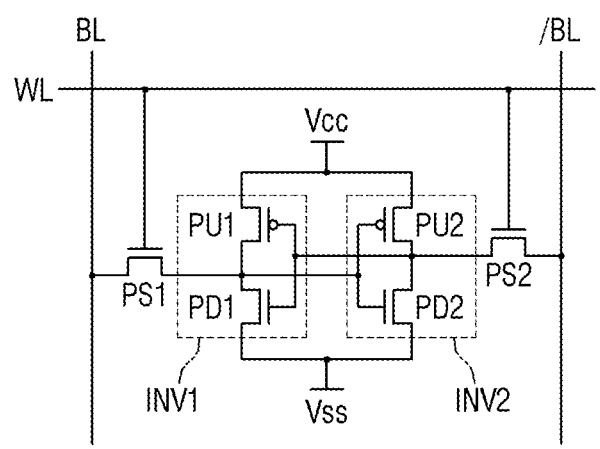
FIGS. 32 and 33 are a circuit view and a layout view provided to explain a semiconductor device according to some example embodiments.
Figure 33:
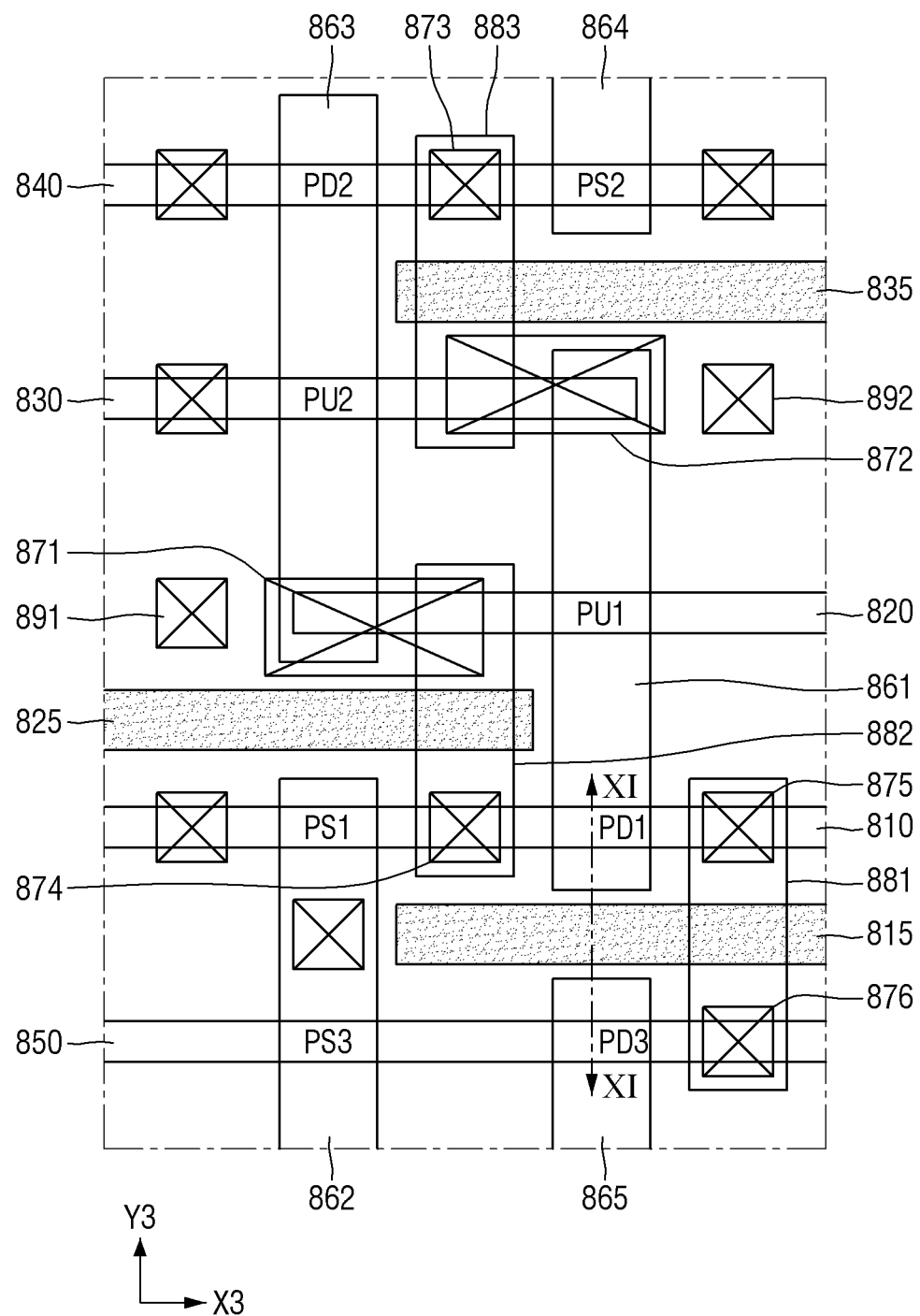

FIGS. 32 and 33 are a circuit view and a layout view provided to explain a semiconductor device according to some example embodiments.

Referring to FIGS. 32 and 33, the semiconductor device according to some example embodiments may include a pair of inverters INV1 and INV2 connected to each other in parallel between a power supply node Vcc and a ground node Vss, and a first pass transistor PS1 and a second pass transistor PS2 respectively connected to output nodes of the inverters INV1 and INV2. The first pass transistor PS1 and the second pass transistor PS2 may be connected to a bit line BL and a complementary bit line/BL, respectively. The gates of the first pass transistor PS1 and the second pass transistor PS2 may be connected to a word line WL.

The first inverter INV1 includes a first pull-up transistor PU1 and a first pull-down transistor PD1 connected in series, and the second inverter INV2 includes a second pull-up transistor PU2 and a second pull-down transistor PD2 connected in series. The first pull-up transistor PU1 and the second pull-up transistor PU2 may be PMOS transistors, and the first pull-down transistor PD1 and the second pull-down transistor PD2 may be NMOS transistors. Further, in order for the first inverter INV1 and the second inverter INV2 to construct one latch circuit, an input node of the first inverter INV1 is connected to the output node of the second inverter INV2, and the input node of the second inverter INV2 is connected to the output node of the first inverter INV1.

In this case, referring to FIGS. 32 and 33, the fifth fin-type pattern 810, the sixth fin-type pattern 820, the seventh fin-type pattern 830, the eighth fin-type pattern 840, and the ninth fin-type pattern 850, being spaced from one another, are so formed as to extend longitudinally in a fifth direction X3. The sixth fin-type pattern 820 and the seventh fin-type pattern 830 may extend a shorter length than the fifth fin-type pattern 810, the eighth fin-type pattern 840, and the ninth fin-type pattern 850. It should be noted that the different directions and/or different components described herein may be describe as first, second, etc., directions or components in relation with each other, even if certain explanations herein give them other names, such as "fifth" and "sixth" directions. For example, the terms "first," "second," "third," etc., are typically used herein as a naming convention, and do not denote a particular order or arrangement of parts, unless explicitly described otherwise. These terms may be used as naming conventions in the claims without necessarily describing any particular embodiment described in the specification that uses the same names.

Further, a first conductive line 861, a second conductive line 862, a third conductive line 863, a fourth conductive line 864, and a fifth conductive line 865 may be formed so as to extend longitudinally in a sixth direction Y3 and intersect and overlap the fifth to ninth fin-type patterns 810, 820, 830, 840, 850. Specifically, the first conductive line 861 may entirely overlap the fifth fin-type pattern 810 and the sixth fin-type pattern 820, and partially overlap with an end of the seventh fin-type pattern 830. The third conductive line 863 may entirely overlap the eighth fin-type pattern 840 and the seventh fin-type pattern 830 and partially overlap with an end of the sixth fin-type pattern 820. The second conductive line 862 may entirely overlap the fifth fin-type pattern 810 and the ninth fin-type pattern 850. The fourth conductive line 864 may be formed so as to overlap the eighth fin-type pattern 840, and the fifth conductive line 865 may be formed so as to overlap the ninth fin-type pattern 850.

Additionally, a third gate insulating support 815 may be formed between the first gate conductive line 861 and the fifth conductive line 865 which are formed to be aligned in a sixth direction Y3. A fourth gate insulating support 825 may be formed between the second conductive line 862 and the third conductive line 863 which are formed in parallel in the sixth direction Y3. A fifth gate insulating support 835 may be formed between the first conductive line 861 and the fourth conductive line 864 which are formed in parallel in the sixth direction Y3.

As shown in the drawings, the first pull-up transistor PU1 may be defined near an intersecting region of the first conductive line 861 and the sixth fin-type pattern 820, the first pull-down transistor PD1 may be defined near an intersecting region of the first conductive line 861 and the fifth fin-type pattern 810, and the first pass transistor PS1 may be defined near an intersecting region of the second conductive line 862 and the fifth fin-type pattern 810. The second pull-up transistor PU2 may be defined near an intersecting region of the third conductive line 863 and the seventh fin-type pattern 830, the second pull-down transistor PD2 may be defined near an intersecting region of the third conductive line 863 and the eighth fin-type pattern 840, and the second pass transistor PS2 may be defined near an intersecting region of the fourth conductive line 864 and the eighth fin-type pattern 840. Further, the third pull-down transistor PD3 may be defined near an intersecting region of the fifth conductive line 865 and the ninth fin-type pattern 850, and the third pass transistor PS3 may be defined near an intersecting region of the second conductive line 862 and the ninth fin-type pattern 850.

Although not clearly shown, the sources/drain may be formed on both (e.g., opposite) sides of the intersecting regions of the first to fifth conductive lines 861-865 and the fifth to eighth fin-type patterns 810, 820, 830, 840, 850. Further, a plurality of contacts may be formed. Moreover, the contacts 875, 876 isolated by the third gate insulating support 815 may be connected by a first connect jumper 881. The contacts 871, 874 isolated by the fourth gate insulating support 825 may be connected by a second connect jumper 882. The contacts 872, 873 isolated by the fifth gate insulating support 835 may be connected by a third connect jumper 883. Additionally, due to the presence of the third to fifth gate insulating supports 815, 825, 835, a plurality of dummy contacts 891, 892 disposed on a device isolating region may be formed without being connected to the source/drain.

A cross sectional view taken on line XI-XI of FIG. 33 may correspond to the cross sectional views taken on line IV-IV of FIG. 1. Thus, at least portions of the embodiment of FIG. 1 may be the same as portions of the embodiment of FIG. 33.

FIGS. 34A to 38B are views illustrating intermediate stages of fabrication, provided to explain a method of fabricating a semiconductor device according to some example embodiments.

Figure 34A:
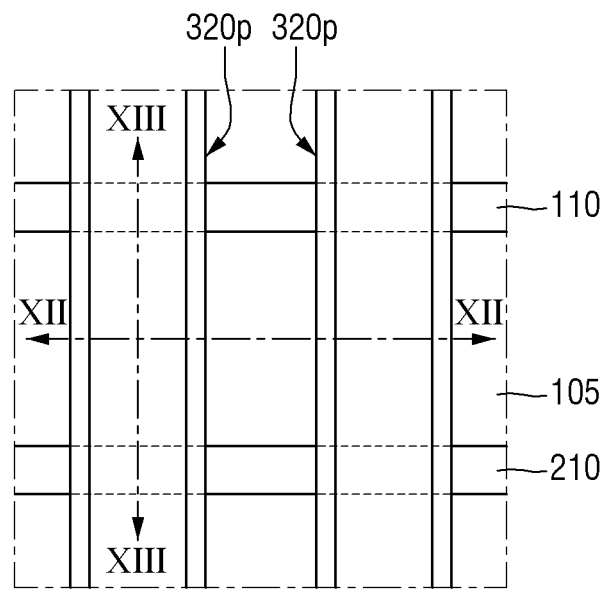
FIGS. 34A-34C, 35A-35B, 36A-36B, 37A-37B, and 38A-38B are views illustrating intermediate stages of fabrication, provided to explain a method of fabricating a semiconductor device according to some example embodiments.
Figure 34B:
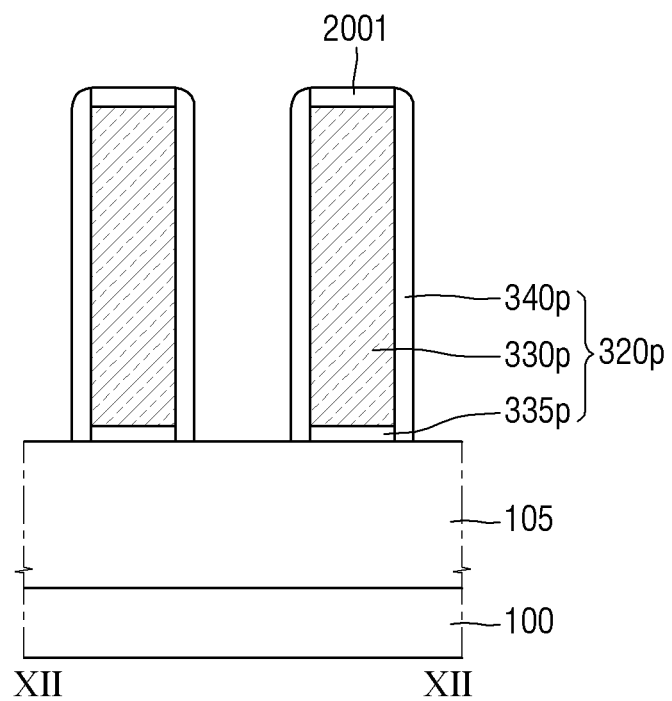
Figure 34C:
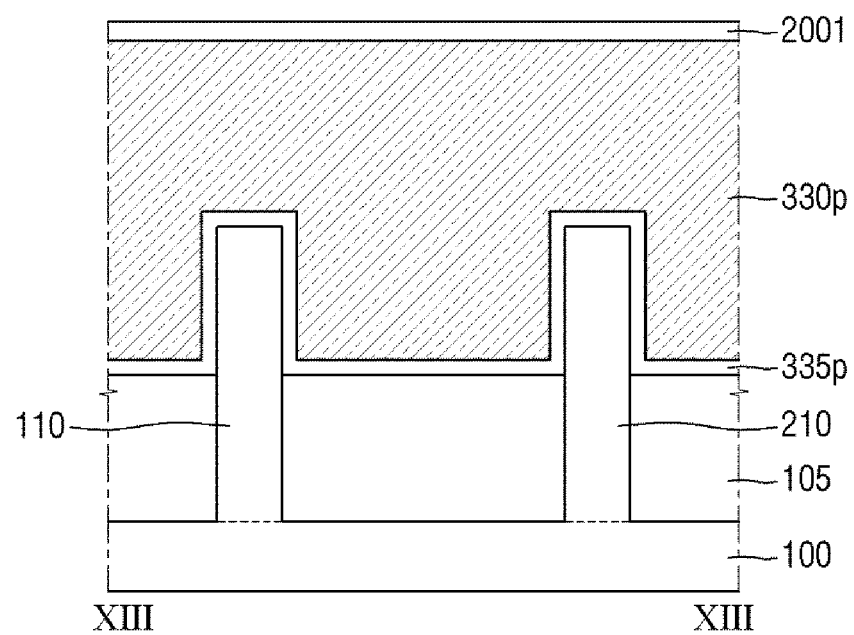

Referring to FIGS. 34A to 34C, a dummy gate structure 320p intersecting and crossing over the first and second fin-type patterns 110, 210 may be formed on the substrate 100.

The first and second fin-type patterns 110, 210 may each extend longitudinally in the first direction X1. The field insulating film 105 on the substrate 100 may partially cover the sidewalls of the first and second fin-type patterns 110, 210. The dummy gate structure 320p may extend in the second direction Y1. The dummy gate structure 320p may include a dummy gate insulating film 335p, a dummy gate electrode 330p and a dummy gate spacer 340p. A gate hard mask 2001 may be formed on the dummy gate electrode 330p. The dummy gate insulating film 335p may include, for example, silicon oxide, and the dummy gate electrode 330p may include, for example, polycrystalline silicon or amorphous silicon.

Figure 35A:
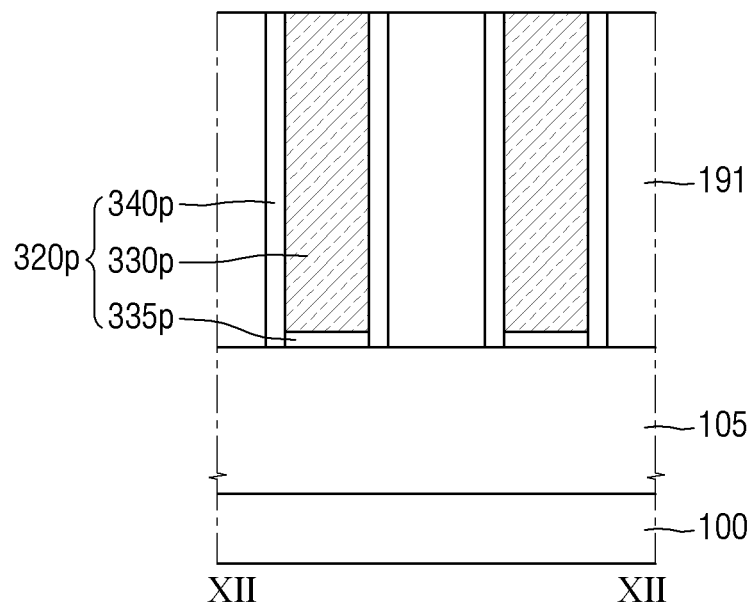
Figure 35B:
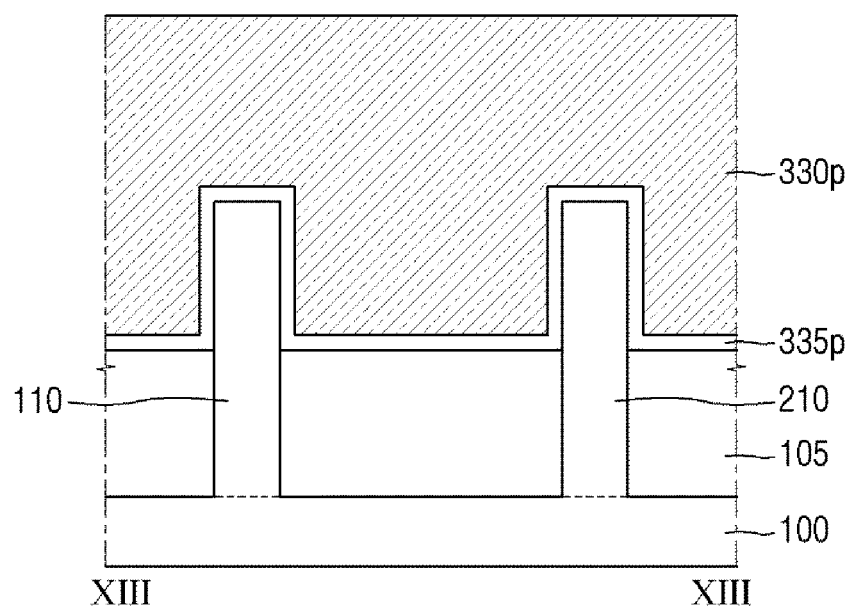

Referring to FIGS. 35A and 35B, the lower interlayer insulating film 191 may be formed on the field insulating film 105, while surrounding the sidewalls of the dummy gate structure 320p and exposing the upper surface of the dummy gate structure 330p. While the lower interlayer insulating film 191 is being formed, the gate hard mask 2001 may be removed.

Figure 36A:
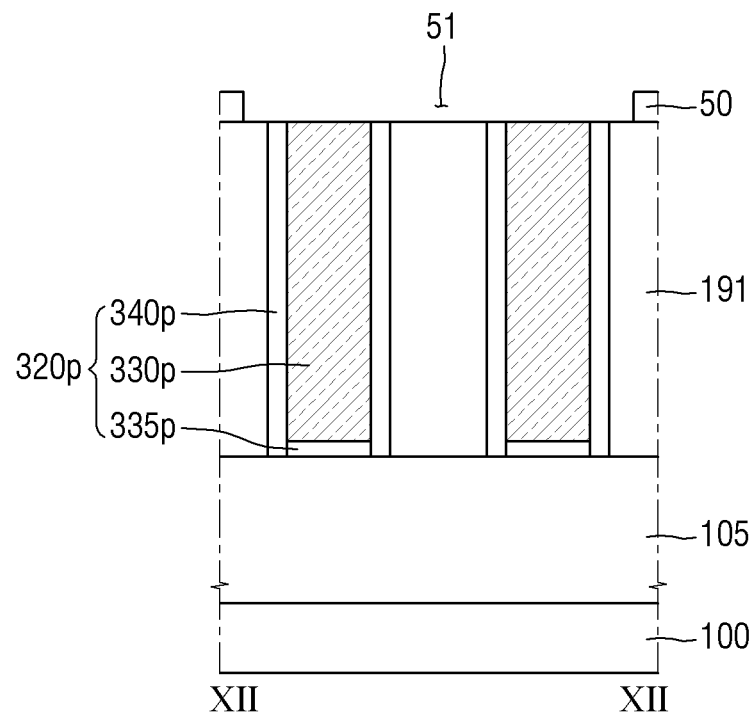
Figure 36B:
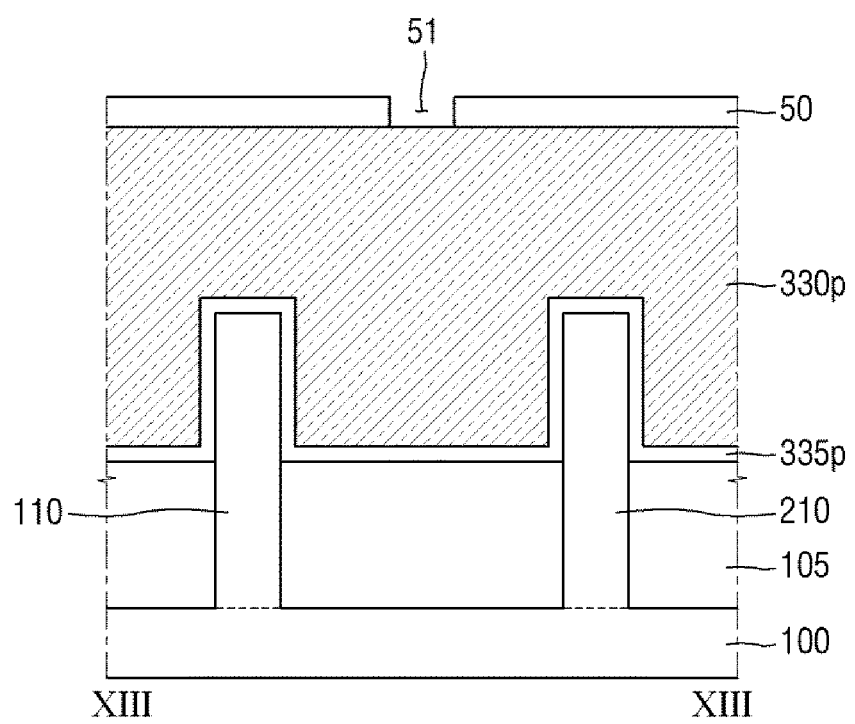

Referring to FIGS. 36A and 36B, a mask pattern 50 including an opening 51 may be formed on the lower interlayer insulating film 191. The opening 51 may expose a portion of the dummy gate structure 320p and a portion of the lower interlayer insulating film 191. A portion of the dummy gate electrode 330p may be exposed by the opening 51.

A width of the opening 51 in the first direction X1 may be greater than a width of the dummy gate structure 320p in the first direction X1.

Figure 37A:
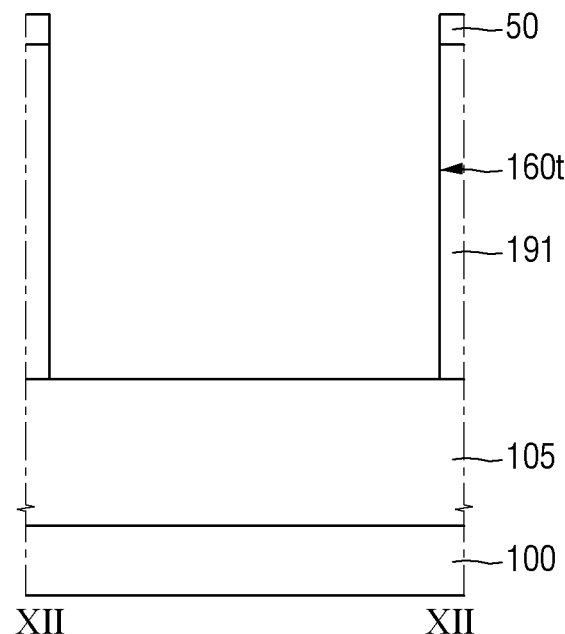
Figure 37B:
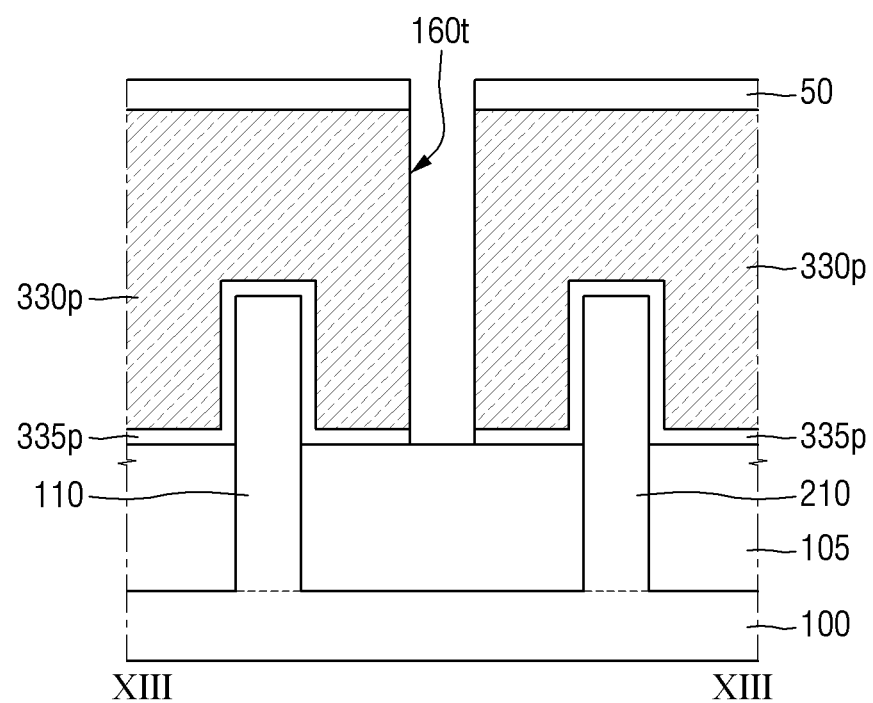

Referring to FIGS. 37A and 37B, the first isolating trench 160t may be formed within the lower interlayer insulating film 191 and the dummy gate structure 320p by removing the dummy gate structure 320p and the lower interlayer insulating film 191 exposed by the opening 51.

The first isolating trench 160t may be formed across the lower interlayer insulating film 191 and the dummy gate structure 320p. The first trench 160t may extend longitudinally in the first direction X1. The first isolating trench 160t may expose the upper surface of the field insulating film 105. During the formation of the first isolating trench 160t, the dummy gate electrode 330p exposed by the opening 51 may be entirely removed.

Figure 38A:
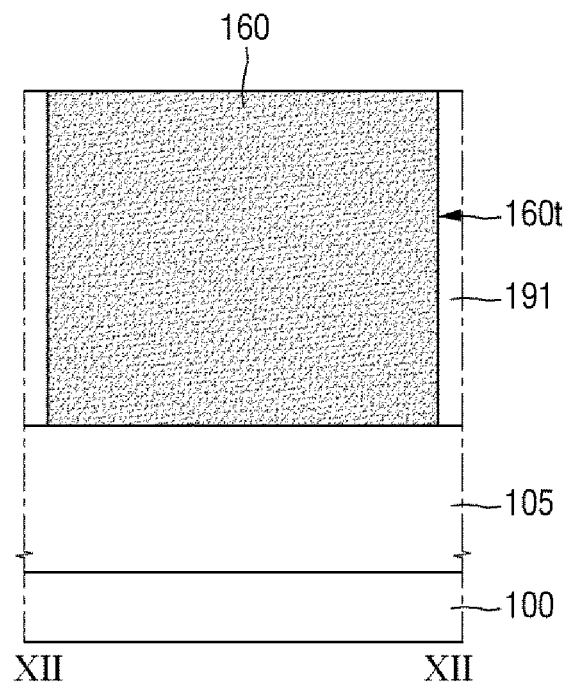
Figure 38B:
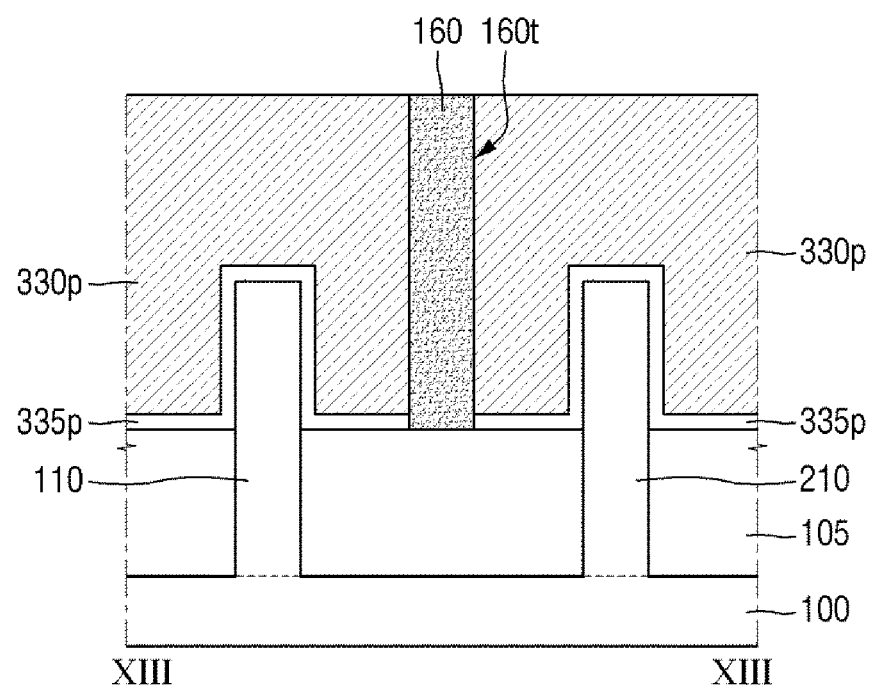

Referring to FIGS. 38A and 38B, the first gate insulating support 160 may be formed by filling an interior of the first isolating trench 160t with an insulating material having etch selectivity with respect to the lower interlayer insulating film 191.

The upper surface of the first gate insulating support 160 may be coplanar with the upper surface of the lower interlayer insulating film 191 and the upper surface of the dummy gate electrode 330p.

Next, referring to FIG. 7, after the dummy gate electrode 330p and the dummy gate insulating film 335p are removed, the third and fourth gate structures 320, 420 intersecting the first and second fin-type patterns 110, 210 may be formed.

FIGS. 39A to 44B are views illustrating intermediate stages of fabrication, provided to explain a method for fabricating a semiconductor device according to some example embodiments.

Figure 39A:
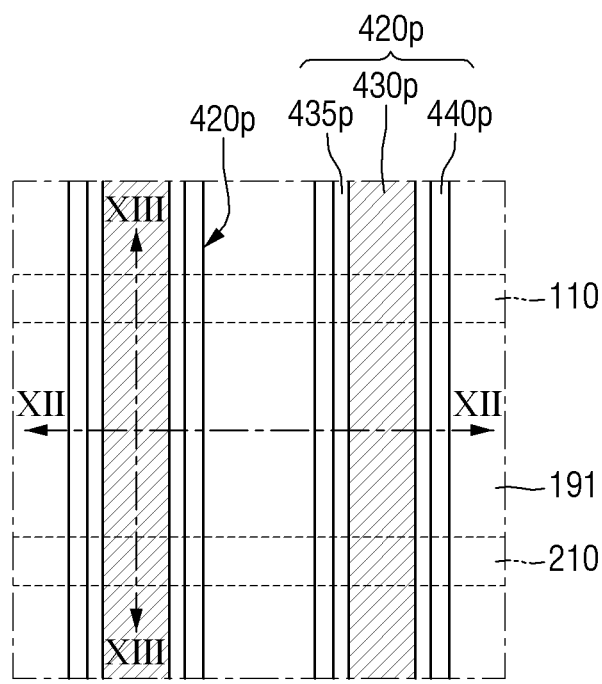
FIGS. 39A-39C, 40A-40B, 41A-41B, 42A-42B, 43A-43B, and 44A-44B are views illustrating intermediate stages of fabrication, provided to explain a method for fabricating a semiconductor device according to some example embodiments.
Figure 39B:
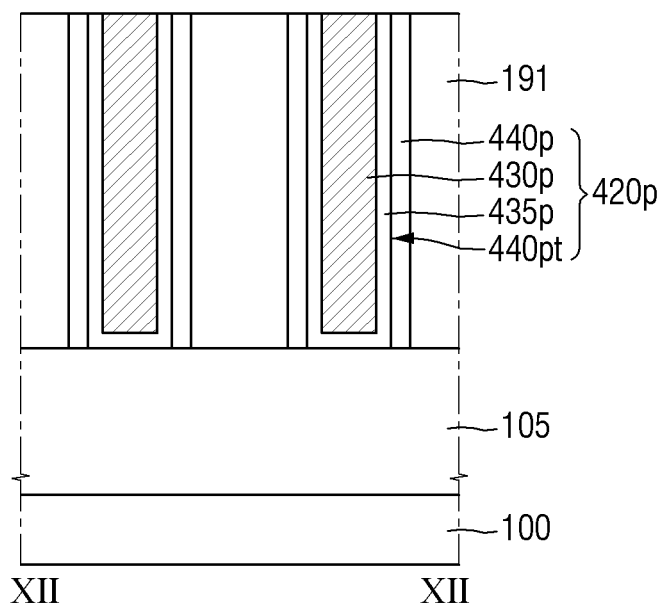
Figure 39C:
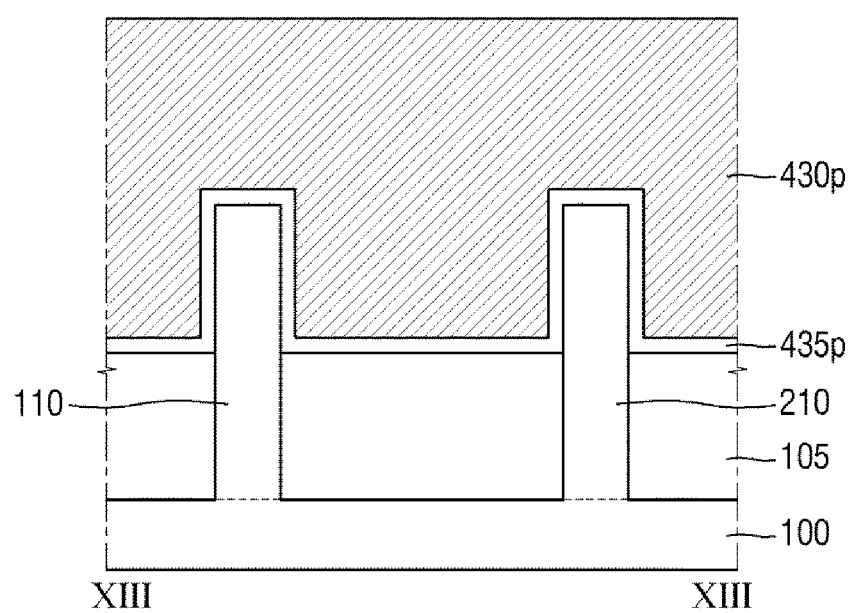

Referring to FIGS. 39A to 39C, a connect gate structure 420p intersecting and crossing the first and second fin-type patterns 110, 210 may be formed on the substrate 100. The sidewall of the connect gate structure 420p may be surrounded by the lower interlayer insulating film 191. The upper surface of the connect gate structure 420p may be coplanar with the upper surface of the lower interlayer insulating film 191.

The first and second fin-type patterns 110, 210 may each extend longitudinally in the first direction X1. The field insulating film 105 on the substrate 100 may partially cover the sidewalls of the first and second fin-type patterns 110, 210. The connect gate structure 420p may extend in the second direction Y1. The connect gate structure 420p may include a connect gate insulating film 435p, a connect gate electrode 430p, and a connect gate spacer 440p. The connect gate insulating film 435p and the connect gate electrode 430p may be formed within a connect gate trench 440pt defined by the connect gate spacer 440p.

Figure 40A:
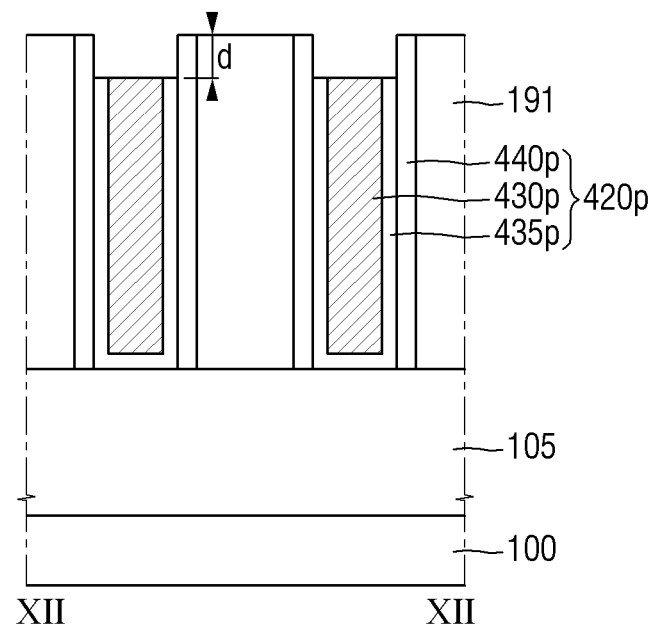
Figure 40B:
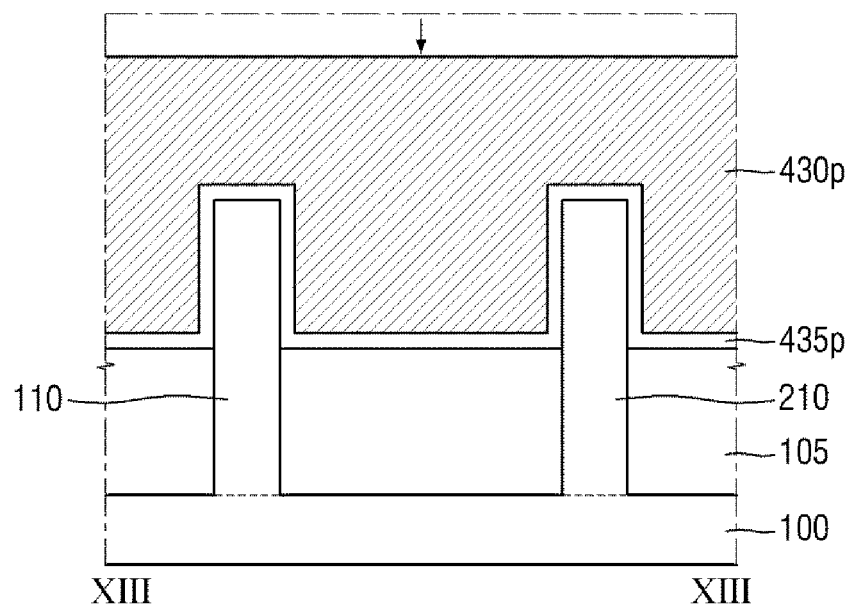

Referring to FIGS. 40A and 40B, the connect gate insulating film 435p and the connect gate electrode 430p may be partially removed. As a result, the upper surface of the connect gate electrode 430p may be lower than the upper surface of the lower interlayer insulating film 191.

The connect gate insulating film 435p and the connect gate electrode 430p may be recessed by an amount "d" based on the upper surface of the lower interlayer insulating film 191.

Figure 41A:
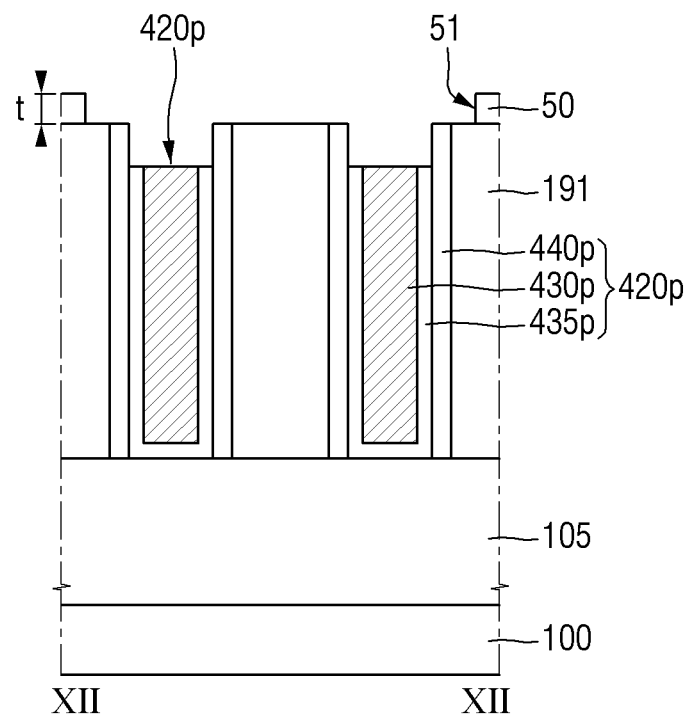
Figure 41B:
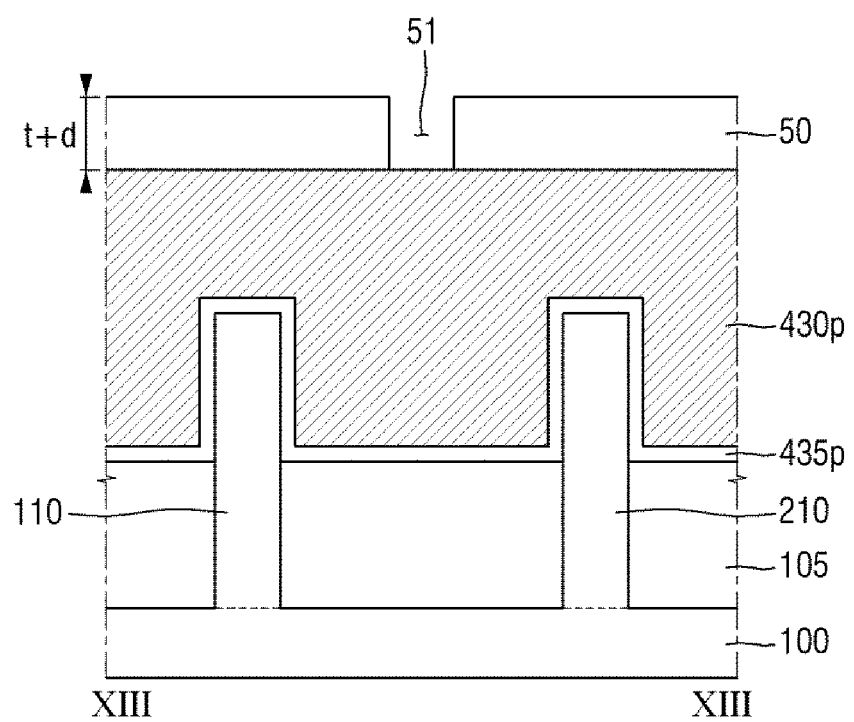

Referring to FIGS. 41A and 41B, the mask pattern 50 including the opening 51 may be formed on the lower interlayer insulating film 191. The opening 51 may expose a portion of the connect gate structure 420p and a portion of the lower interlayer insulating film 191.

A width of the opening 51 in the first direction X1 may be greater than a width of the connect gate structure 420p in the first direction X1. Further, because the connect gate insulating film 435p and the connect gate electrode 430p may be recessed by d, a thickness t of the mask pattern 50 on the lower interlayer insulating film 191 may be less than a thickness t+d of the mask pattern 50 on the connect gate electrode 430p.

Figure 42A:
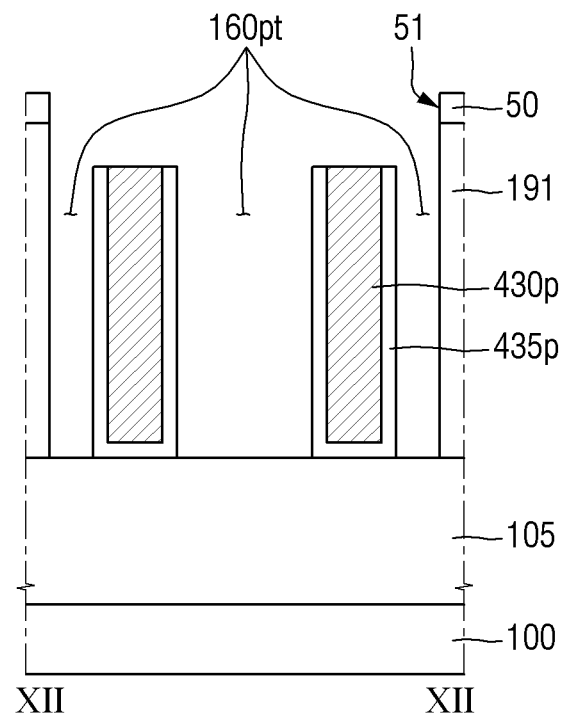
Figure 42B:
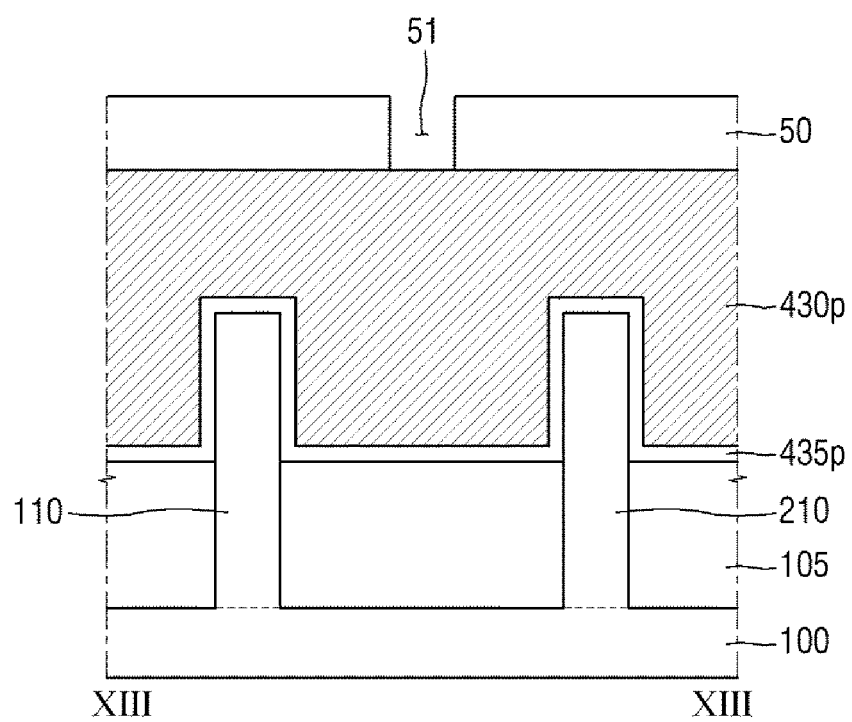

Referring to FIGS. 42A and 42B, a pre-isolating trench 160t may be formed on the field insulating film 105 by removing the lower interlayer insulating film 191 and the connect gate spacer 440p exposed by the opening 51.

Figure 43A:
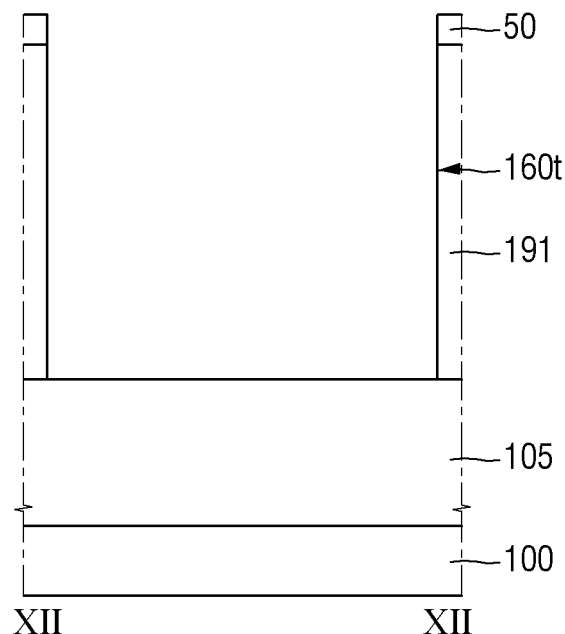
Figure 43B:
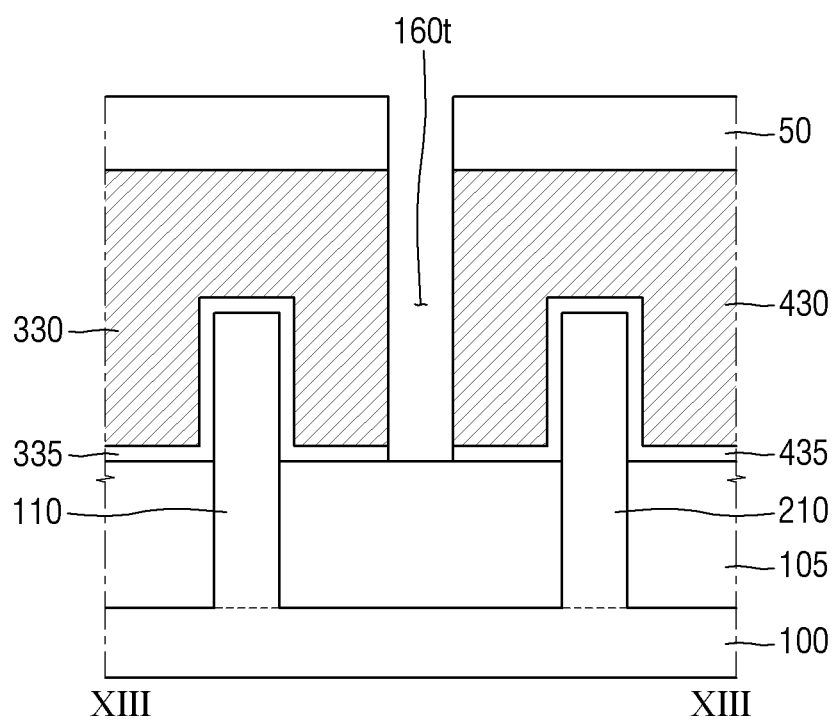

Referring to FIGS. 43A and 43B, the first isolating trench 160t may be formed by removing the connect gate insulating film 435p and the connect gate electrode 430p exposed by the opening 51. The third gate electrode 330 intersecting the first fin-type pattern 110 may be formed and the fourth gate electrode 430 intersecting the second fin-type pattern 210 may be formed, by removing the connect gate insulating film 435p and the connect gate electrode 430p which are exposed by the opening 51.

Figure 44A:
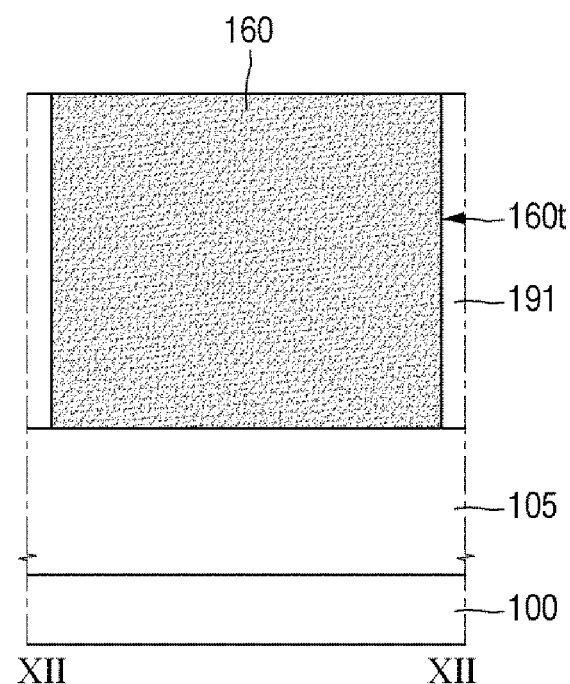
Figure 44B:
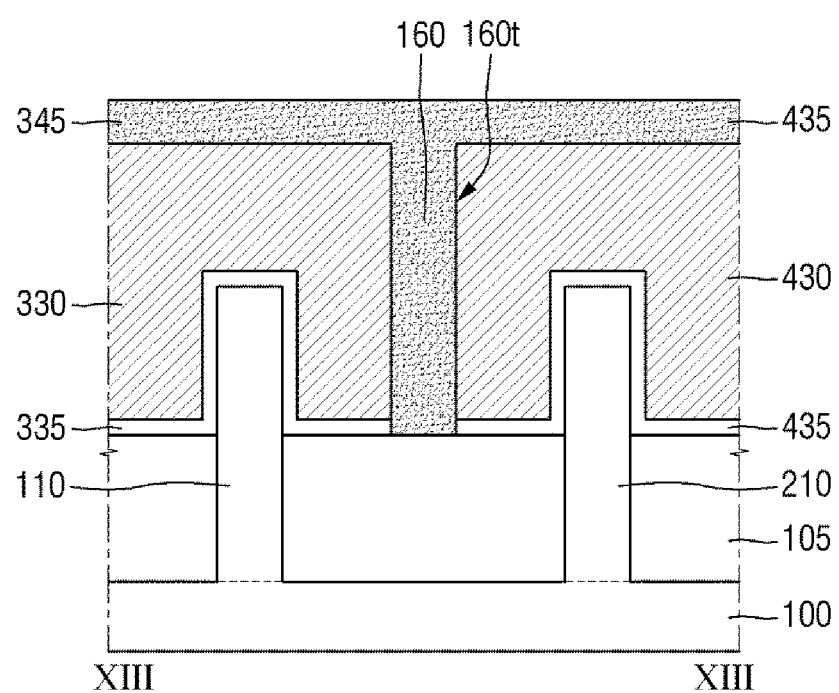

Referring to FIGS. 44A and 44B, the first gate insulating support 160 may be formed by filling an interior of the first isolating trench 160t with an insulating material having etch selectivity with respect to the lower interlayer insulating film 191. The third and fourth capping patterns 345, 445 may be formed together with the first gate insulating support 160.

In concluding the detailed description, those skilled in the art will appreciate that many variations and modifications can be made to the disclosed embodiments without substantially departing from the principles of the present inventive concept. Therefore, the disclosed embodiments of the inventive concept are used in a generic and descriptive sense only and not for purposes of limitation.

What is claimed is:
1. A semiconductor device, comprising:
a first fin-type pattern extending in a first direction;
a second fin-type pattern extending in the first direction, and being adjacent to the first fin-type pattern in a second direction different form the first direction;
a first gate structure on the first fin-type pattern, the first gate structure intersecting the first fin-type pattern and including a first gate spacer;
a second gate structure on the first fin-type pattern, the second gate structure intersecting the first fin-type pattern and including a second gate spacer;
a gate insulating support extending in the first direction between the first gate structure and the second gate structure, a width of the gate insulating support in the first direction being greater than a width of the first gate structure in the first direction and greater than a width of the second gate structure in the first direction; and
a conductive jumper on the gate insulating support, the conductive jumper intersecting the gate insulating support,
wherein the gate insulating support contacts a lower surface of the conductive jumper, the lower surface of the conductive jumper being lower than an upper surface of the first and second gate structures.

2. The semiconductor device of claim 1, further comprising:
a first epitaxial pattern on at least one side of the first gate structure and formed on the first fin-type pattern; and
a second epitaxial pattern on at least one side of the second gate structure and formed on the second fin-type pattern, the conductive jumper being electrically connected to the first epitaxial pattern and the second epitaxial pattern.

3. The semiconductor device of claim 2, further comprising:
a first contact connected to the first epitaxial pattern, a second contact connected to the second epitaxial pattern, and an interlayer insulating film on the first gate structure, the second gate structure, and the gate insulating support,
wherein the interlayer insulating film has a jumper hole exposing the first contact, the second contact, and the gate insulating support, and
the conductive jumper is formed within the jumper hole.

4. The semiconductor device of claim 1, further comprising an air gap formed within the gate insulating support.

5. The semiconductor device of claim 1, wherein a height from a substrate to a bottom surface of the gate insulating support is less than or equal to a height from the substrate to a bottom-most surface of the first gate structure.

6. The semiconductor device of claim 1, wherein the first gate structure includes a trench defined by the first gate spacer, a gate electrode filling a portion of the trench, and a capping pattern filling the trench on the gate electrode.

7. The semiconductor device of claim 6, wherein the capping pattern and the gate insulating support are an integral structure.

8. The semiconductor device of claim 1, wherein the first gate structure and the second gate structure are isolated from each other by the gate insulating support.

9. The semiconductor device of claim 1, wherein an upper surface of the gate insulating support is coplanar with an upper surface of the first gate structure and an upper surface of the second gate structure.

10. The semiconductor device of claim 1, wherein the gate insulating support is an insulation block formed of a continuous material to have a monolithic structure.

11. A semiconductor device, comprising:
a first fin-type pattern extending in a first direction;
a second fin-type pattern extending in the first direction, and being adjacent to the first fin-type pattern in a second direction different form the first direction;
a first gate structure on the first fin-type pattern, the first gate structure intersecting the first fin-type pattern and including a first gate spacer;
a second gate structure on the second fin-type pattern, the second gate structure intersecting the second fin-type pattern and including a second gate spacer;
a gate insulating support extending in the first direction between the first gate structure and the second gate structure, a width of the gate insulating support in the first direction being greater than a width of the first gate structure in the first direction and greater than a width of the second gate structure in the first direction; and
a conductive jumper on the gate insulating support, the conductive jumper intersecting the gate insulating support,
wherein an upper surface of the gate insulating support includes at least a contact portion contacting a lower surface of the conductive jumper and an other portion not contacting the lower surface of the conductive jumper, the contact portion being lower than the other portion.

12. The semiconductor device of claim 11, further comprising an air gap formed within the gate insulating support.

13. The semiconductor device of claim 11, wherein a height from a substrate to a bottom surface of the gate insulating support is less than or equal to a height from the substrate to a bottom-most surface of the first gate structure.

14. The semiconductor device of claim 11, wherein the first gate structure includes a trench defined by the first gate spacer, a gate electrode filling a portion of the trench, and a capping pattern filling the trench on the gate electrode.

15. The semiconductor device of claim 11, wherein the first gate structure and the second gate structure are isolated from each other by the gate insulating support.

16. The semiconductor device of claim 11, wherein an upper surface of the gate insulating support is coplanar with an upper surface of the first gate structure and an upper surface of the second gate structure.

17. A semiconductor device, comprising:
a first fin-type pattern extending in a first direction;
a second fin-type pattern extending in the first direction, and being adjacent to the first fin-type pattern in a second direction different form the first direction;
a first gate structure on the first fin-type pattern, the first gate structure intersecting the first fin-type pattern and including a first gate spacer;
a second gate structure on the second fin-type pattern, the second gate structure intersecting the second fin-type pattern and including a second gate spacer;
a first epitaxial pattern on at least one side of the first gate structure and formed on the first fin-type pattern;
a second epitaxial pattern on at least one side of the second gate structure and formed on the second fin-type pattern;
a gate insulating support extending in the first direction between the first gate structure and the second gate structure and between the first epitaxial pattern and the second epitaxial pattern, a width of the gate insulating support in the first direction being greater than a width of the first gate structure in the first direction and greater than a width of the second gate structure in the first direction;
a first contact connected to the first epitaxial pattern and a second contact connected to the second epitaxial pattern; and
a conductive jumper on the gate insulating support, the conductive jumper intersecting the gate insulating support, and being electrically connected to the first contact and the second contact,
wherein an upper surface of the gate insulating support is lower than an upper surface of the first contact.

18. The semiconductor device of claim 17, further comprising: an interlayer insulating film on the first gate structure, the second gate structure, and the gate insulating support,
wherein the interlayer insulating film has a jumper hole exposing the first contact, the second contact, and the gate insulating support, and
the conductive jumper is formed within the jumper hole.

19. The semiconductor device of claim 17, further comprising an air gap formed within the gate insulating support.

20. The semiconductor device of claim 17, wherein a height from a substrate to a bottom surface of the gate insulating support is less than or equal to a height from the substrate to a bottom-most surface of the first gate structure.

\* \* \* \* \*